(12) United States Patent
Pezzin et al.

(10) Patent No.: US 11,137,312 B2
(45) Date of Patent: *Oct. 5, 2021

(54) INTEGRATED FAULT MONITORING APPARATUS FOR ELECTRICAL EQUIPMENT

(71) Applicant: IFD Internal Fault Detector Corp., Vancouver (CA)

(72) Inventors: Justin George Pezzin, Coquitlam (CA); Jeremy Michael Van Horn, Burnaby (CA); Yen-You Lin, Surrey (CA); John Paul Chisholm, Vancouver (CA); Sophie Anne Ramsden, West Vancouver (CA)

(73) Assignee: IFD INTERNAL FAULT DETECTOR CORP., Vancouver (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/794,693

(22) Filed: Feb. 19, 2020

(65) Prior Publication Data

US 2020/0191880 A1    Jun. 18, 2020

Related U.S. Application Data

(63) Continuation of application No. 15/550,341, filed as application No. PCT/CA2016/050171 on Feb. 19, 2016, now Pat. No. 10,605,849.

(Continued)

(51) Int. Cl.
*G01L 23/02* (2006.01)
*G01K 5/70* (2006.01)
(Continued)

(52) U.S. Cl.
CPC .............. *G01L 23/02* (2013.01); *G01K 5/70* (2013.01); *G01L 23/04* (2013.01); *G01R 31/50* (2020.01);
(Continued)

(58) Field of Classification Search
CPC ........ G01R 31/50; G01R 31/62; G01R 31/64; G01R 31/52; G01R 31/00; G01L 23/04; G01L 23/02; G01K 5/70; H05K 5/02
(Continued)

(56) References Cited

U.S. PATENT DOCUMENTS 3,680,359 A   8/1972  Lynch
3,812,816 A   5/1974  Juhasz
(Continued)

FOREIGN PATENT DOCUMENTS

EP   1252492 B1   6/2010
GB    568055 A    3/1945
GB   1558414 A    1/1980

*Primary Examiner* — Farhana A Hoque
(74) *Attorney, Agent, or Firm* — Oyen Wiggs Green & Mutala LLP

(57) ABSTRACT

An integrated fault monitoring apparatus for electrical devices has an internal fault detector for detecting transient pressure surges within the electrical device, a pressure relief valve for allowing release of pressure during normal operating conditions of the electrical device, a temperature indicator for indicating that an operating temperature of the electrical device has gone above a predetermined threshold, and/or a sudden pressure relief device for allowing air to escape from the electrical device in the event of a sudden and significant increase in pressure within the electrical device. Methods of using the apparatus are provided.

22 Claims, 15 Drawing Sheets

Related U.S. Application Data

(60) Provisional application No. 62/119,687, filed on Feb. 23, 2015.

(51) Int. Cl.
    *G01R 31/50*     (2020.01)
    *G01R 31/62*     (2020.01)
    *G01R 31/64*     (2020.01)
    *G01R 31/52*     (2020.01)
    *G01L 23/04*     (2006.01)

(52) U.S. Cl.
    CPC ............. *G01R 31/52* (2020.01); *G01R 31/62* (2020.01); *G01R 31/64* (2020.01)

(58) Field of Classification Search
    USPC .................................................. 324/500, 547
    See application file for complete search history.

(56) References Cited

U.S. PATENT DOCUMENTS

| | | |
|---|---|---|
| 3,816,801 A | 6/1974 | Almand |
| 3,855,503 A | 12/1974 | Ristuccia |
| 3,972,364 A | 8/1976 | Brumm |
| 4,010,708 A | 3/1977 | Keledy et al. |
| 4,240,372 A | 12/1980 | Davis |
| 4,494,566 A | 1/1985 | Sinclair et al. |
| 4,654,643 A | 3/1987 | Meisenheimer |
| 4,823,224 A | 4/1989 | Hagerman et al. |
| 4,831,957 A | 5/1989 | Goans |
| 5,078,078 A | 1/1992 | Cuk |
| 5,597,091 A | 1/1997 | Mah et al. |
| 5,623,891 A | 4/1997 | Miller |
| 5,859,590 A | 1/1999 | Otani |
| 5,946,171 A | 8/1999 | Magnier |
| 6,429,662 B1 | 8/2002 | Cuk et al. |
| 6,812,713 B2 * | 11/2004 | Cuk ......................... G01L 19/12 324/547 |
| 7,711,500 B1 | 5/2010 | Killion et al. |
| 10,605,849 B2 * | 3/2020 | Pezzin .................... G01R 31/50 |
| 2012/0086231 A1 | 4/2012 | Wilke et al. |
| 2013/0074603 A1 * | 3/2013 | Pezzin .................... G01L 23/02 73/716 |
| 2016/0004260 A1 | 1/2016 | Peace |

\* cited by examiner

INTEGRATED FAULT MONITORING APPARATUS FOR ELECTRICAL EQUIPMENT

REFERENCE TO RELATED APPLICATIONS

This application is a continuation of U.S. patent application Ser. No. 15/550,341 filed 19 Feb. 2016, which is a 371 of Patent Cooperation Treaty application No. PCT/2016/050171 filed 19 Feb. 2016, which claims benefit of U.S. provisional patent application No. 62/119,687 filed 23 Feb. 2015. Each of the foregoing applications is hereby incorporated by reference in its entirety for all purposes.

TECHNICAL FIELD

Some embodiments of the present invention relate to apparatus or methods for monitoring the performance of electrical equipment such as transformers, reactors, capacitors and the like. Some embodiments of the present invention relate to apparatus or methods for detecting faults in electrical equipment. Some embodiments of the present invention have particular application in electrical components used in electrical power distribution systems.

BACKGROUND

Electrical power distribution grids use electrical components, such as transformers, capacitors, and reactors. Potentially dangerous conditions can be created in such devices when aging or operating stresses cause the insulation system to fail. A short circuit within such a device can release a large amount of energy within a fraction of a second. In the worst case the device can explode due to rapid internal pressure buildup from the vaporization of insulating oil and the decomposition of the oil vapor into combustible or volatile gases.

It is known that there is a transient or rapid surge in pressure inside oil-filled electrical devices, such as transformers or voltage regulators, when the devices suffer from an internal arcing fault. This happens because arcing produces a marked increase in temperature which vaporizes some of the oil. Some electrical devices are filled with electrically insulating gases such as $SF_6$. Devices for detecting such rapid pressure surges, and for indicating that such rapid pressure surges have occurred within an electrical device, are known, for example as described in U.S. Pat. Nos. 6,812,713, 6,429,662, 5,078,078, and Patent Cooperation Treaty publication No. WO 2011/153604, all of which are hereby incorporated by reference herein. Such devices may also include a pressure relief valve for relieving a buildup of pressure within the electrical device during normal operation.

Higher operating temperatures in electrical devices can indicate that the electrical device is not sufficiently robust to perform the job for which it has been deployed. Thus, information about the temperature at which an electrical device is operating can provide useful information regarding the appropriateness of that electrical device to its current operating location.

Devices such as pressure relief valves may be used to vent increases in pressure within an electrical device during a range of normal operating conditions. It may be desirable for an operator to know that a pressure relief valve has been actuated on a device.

It may be desirable to provide rapid venting (i.e. to an extent beyond that provided by a conventional pressure relief valve) of an electrical device, in the event that there is a sudden buildup of pressure within the device.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention provides an integrated fault monitoring apparatus for electrical devices that has an internal fault detector for detecting transient pressure surges within the electrical device, a pressure relief valve for allowing release of pressure during normal operating conditions of the electrical device, a temperature indicator for indicating that an operating temperature of the electrical device has gone above a predetermined threshold, and a sudden pressure relief device for allowing air to escape from the electrical device in the event of a sudden and significant increase in pressure within the electrical device.

The internal fault detector can include a two-bar self-locking linkage and a pressure sensing member adapted to convert a transient pressure surge within the electrical device to translational movement, the pressure sensing member being operatively disposed to move the two-bar self-locking linkage from an armed configuration in which the two-bar self locking linkage is rigid to a triggered configuration in which the two-bar self-locking linkage is rotatable about a central rotation point of the linkage upon the occurrence of a transient pressure surge, and an indicator adapted to provide a signal in response to movement of the two-bar self-locking linkage from the armed configuration to the triggered configuration. In some embodiments, the internal fault detector is used alone, without one or more of the temperature indicator, pressure relief valve, and/or the sudden pressure relief valve.

In some embodiments, the sudden pressure relief valve has a two-bar self-locking linkage and a pair of snap-fit restraining members engaged with a release plate of the housing to secure the release plate in a closed position, the snap-fit restraining members being retained in a secured configuration when the two-bar self-locking linkage is in an armed configuration in which the two-bar self-locking linkage is rigid, the snap-fit restraining members being moveable to a released position allowing the release plate of the housing to move to an open position when the two-bar self-locking linkage is moved to a triggered configuration in which the two-bar self-locking linkage is rotatable about a central rotation point of the linkage upon an increase in pressure within the housing above a predetermined threshold, and a mechanism for converting increases in pressure within the housing to translational movement, the mechanism being operatively engaged with the two-bar self-locking linkage to move the two-bar self-locking linkage from the armed configuration to the triggered configuration upon an increase in pressure within the electrical device above a predetermined threshold. In some embodiments, the sudden pressure relief valve is used alone, without one or more of the internal fault detector, temperature indicator, and/or pressure relief valve.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

As used herein, the relative directional terms "up", "down", "top", "bottom", "vertical", "horizontal", and the like, are used with reference to the intended orientation of an integrated fault monitor in its installed configuration. It will be appreciated that such terms are relative only, and that the integrated fault monitor could have other orientations when not in use.

An integrated fault monitor as described herein can be used with a variety of high power electrical devices, including pole-type transformers, padmount transformers, or voltage regulators. While an example embodiment is described with reference to an oil-filled pole-type transformer, some embodiments of the invention are also used with gas-filled transformers.

Figure 1A:
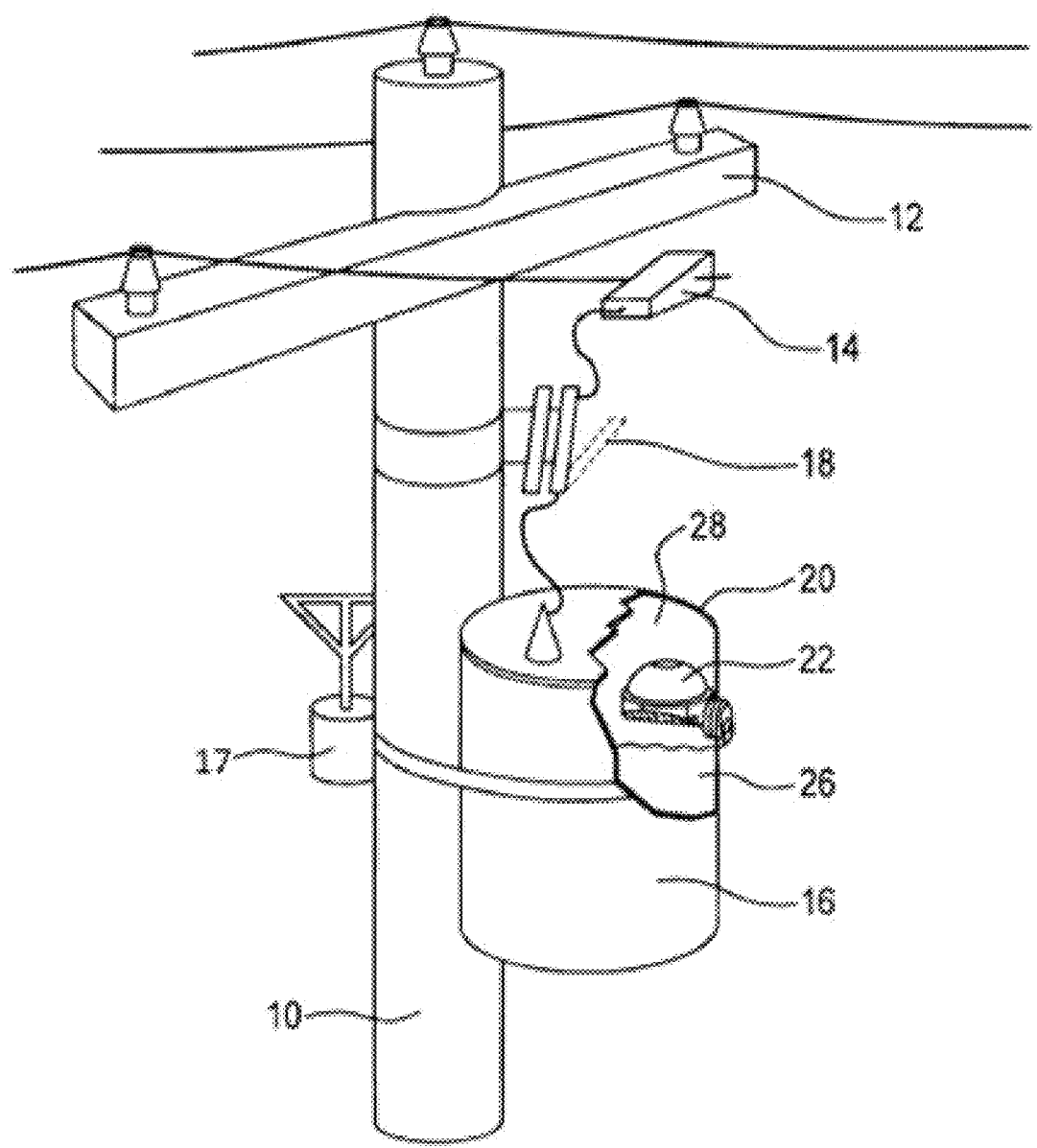
FIG. 1A illustrates a typical oil-filled pole-mount transformer incorporating an example embodiment of an integrated fault monitor mounted on a side of the transformer.

FIG. 1A shows an example embodiment of an integrated fault monitor 22 used in conjunction with an oil-filled pole-type transformer. A typical distribution pole 10 has a crossarm 12 supporting power lines 14.

A transformer 16 is mounted on pole 10, and is connected via a fused cutout 18 to one of the lines 14. When cutout 18 opens, it hinges downwardly as illustrated in FIG. 1A. This breaks the circuit between transformer 16 and line 14.

Transformer 16 has a housing or "tank" 20. An example embodiment of an integrated fault monitor 22 is mounted in an aperture (not shown) in a side wall of tank 20. In some embodiments, the aperture is a small hole, and may have for example a diameter of approximately 1.35 inches (34.0 mm), which is a commonly used hole size for inserting various equipment onto transformers and the like. Tank 20 contains electrically insulating fluid 26, which may be for example an oil such as insulating mineral oil or Nynas Nytro™ (made from naphthenic oils), or an ester-based fluid such as Envirotemp FR3™ fluid (made from seeds), or an electrically insulating gas such as $SF_6$. Integrated fault monitor 22 is located in an air space 28 above the level of electrically insulating fluid 26 in tank 20 for fluid-filled transformers, or preferably above the core or coil for gas-filled transformers.

Figure 1B:
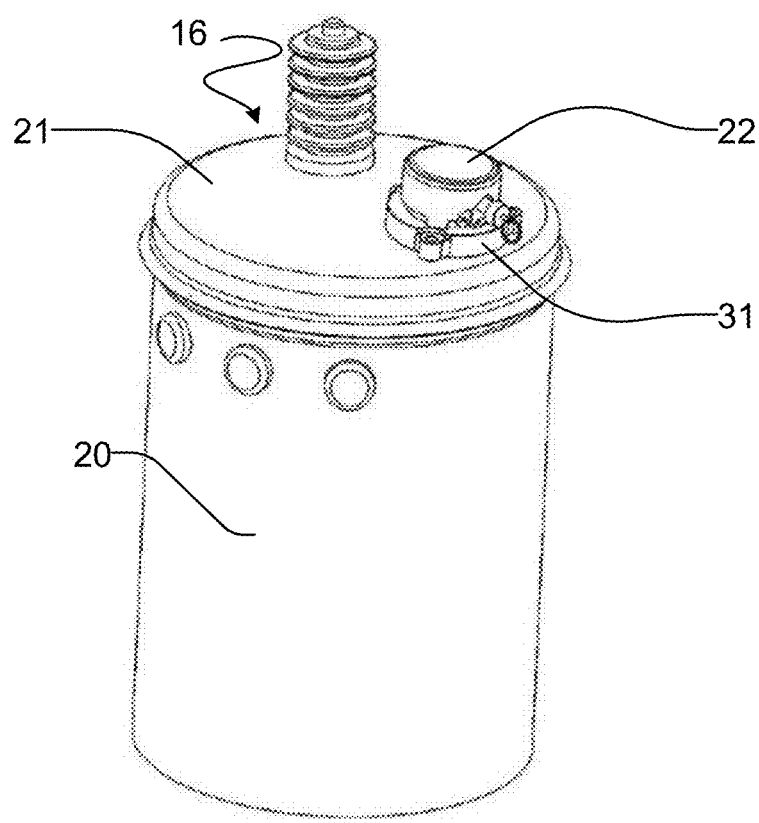
FIG. 1B is a perspective view and FIG. 1C is a top view of an alternative example embodiment of an integrated fault monitor mounted on top of a transformer.
Figure 1C:
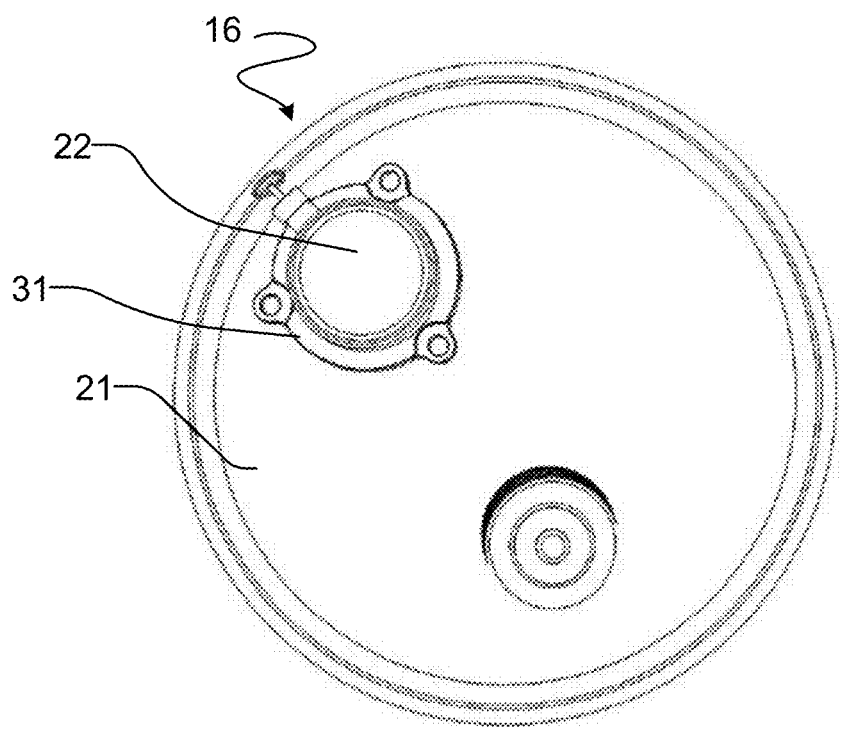

While the integrated fault monitor 22 illustrated in FIG. 1A is mounted in the side of tank 20, in alternative embodiments as illustrated in FIGS. 1B and 1C, integrated fault monitor 22 is installed through an aperture formed in the lid 21 of tank 20. In some such embodiments, installing integrated fault monitor 22 in the lid 21 of tank 20 allows integrated fault monitor 22 to be installed at a higher position in tank 20, and may provide for increased sensitivity of integrated fault monitor 22 and/or facilitate installation of integrated fault monitor 22.

An example embodiment of an integrated fault monitor 22 has an internal fault detector 100, a pressure relief valve 200, a sudden pressure relief device 300, and a temperature monitor 400, each of which is described in greater detail below.

Figure 2A:
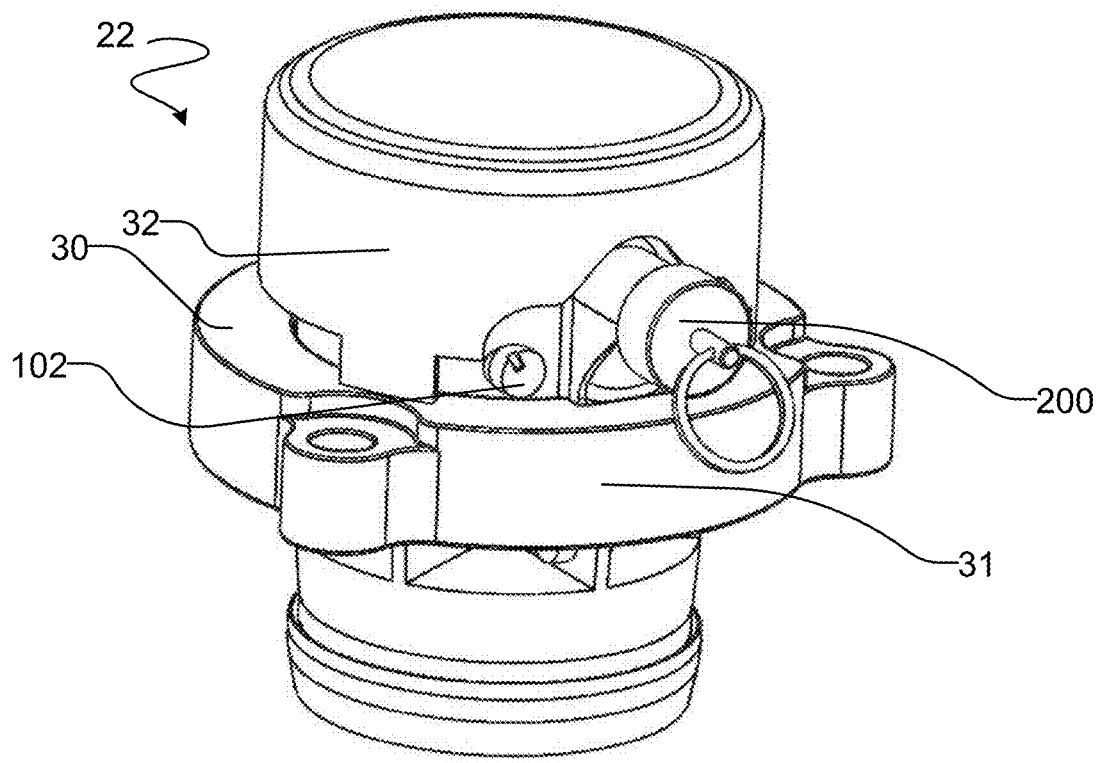
FIG. 2A is a top left perspective view and FIG. 2B is a top right perspective view of an example embodiment of an integrated fault monitor.
Figure 2B:
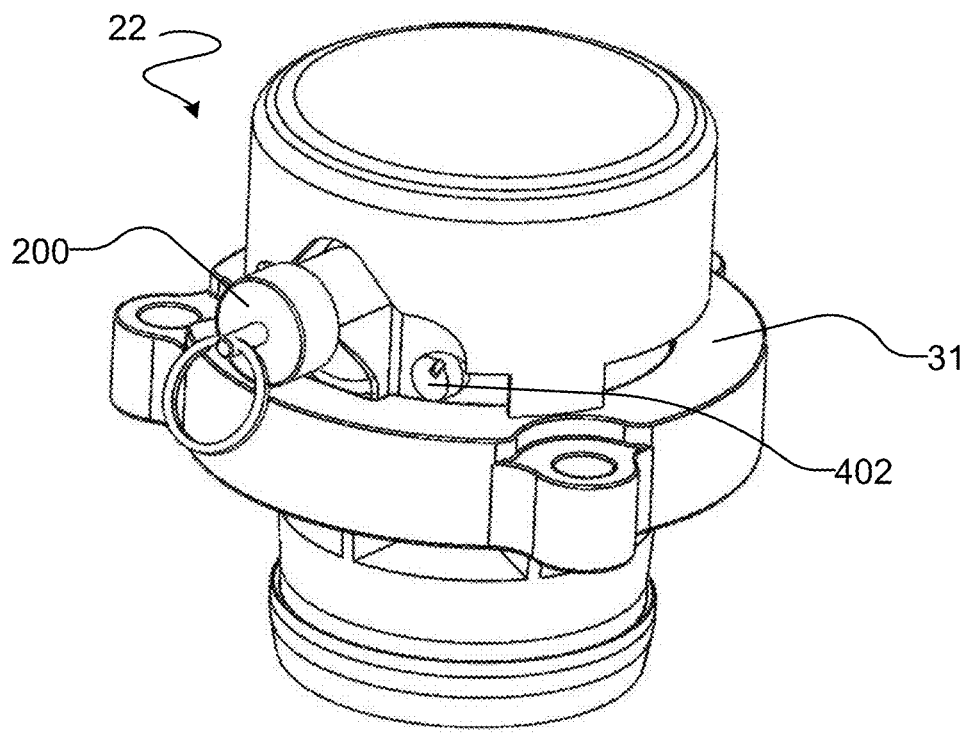

With reference to FIGS. 2A and 2B, integrated fault monitor 22 has a housing 30, with a cap 32 covering the top portion of housing 30. A flange 31 is provided for mounting integrated fault monitor 22 within or on an electrical device, although integrated fault monitor 22 can be secured to the transformer in any suitable manner, for example using a threaded connection or other clamping system common to the industry. The mechanism used to secure integrated fault monitor 22 to an electrical device depends on the design of the particular electrical device with which it is to be used.

Figure 3:
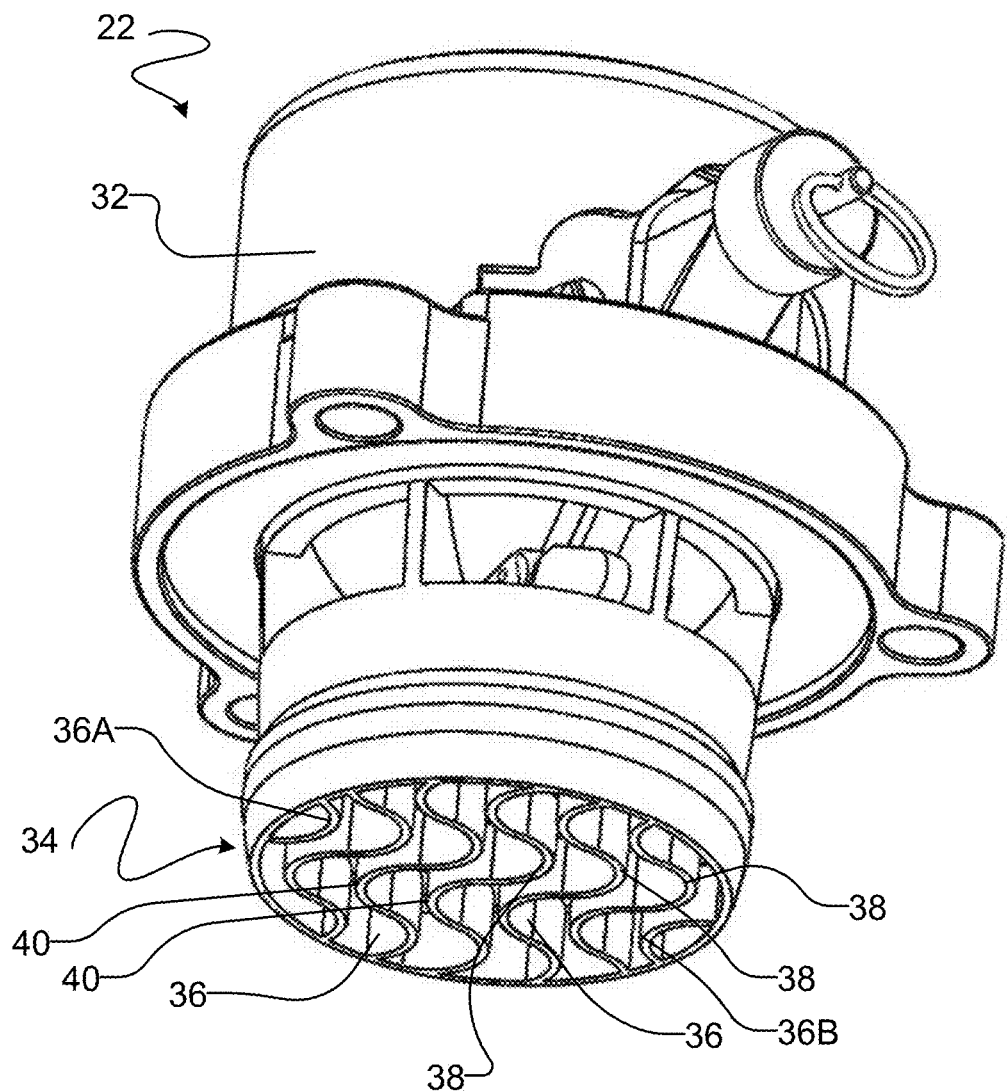
FIG. 3 is a bottom perspective view of an example embodiment of an integrated fault monitor, showing the splash guard thereof.

With reference to FIG. 3, integrated fault monitor 22 includes a splash guard 34, to prevent oil from splashing onto interior components of fault monitor 22, including internal fault detector 100. Oil might splash, for example, if tank 20 was shaken by an earthquake or otherwise disturbed. Splash guard 34 can be secured to housing 30 of integrated fault monitor 20 in any suitable manner, for example using clips, clamps, adhesives or the like.

Any structural element capable of preventing fluid from splashing onto components of internal fault detector 100 while still allowing air to flow and pressure changes to be passed therethrough can be used to provide splash guard 34. In the illustrated embodiment, splash guard 34 comprises a wave pattern splash guard. The structural elements that provide wave pattern splash guard 34 comprise a series of interwoven vertically extending bars of relatively thin material 36 that are provided with a sinusoidal shape in the horizontal direction.

As illustrated in FIG. 3, the vertical bars 36 of splash guard 34 are provided with a sinusoidal shape that extends in the horizontal direction, so that each vertical bar 36 has one or more peaks 38 adjacent one or more valleys 40 of the sinusoidal form. In the illustrated embodiment, the peaks 38 of each adjacent vertical bar 36 are aligned and the valleys 40 of each adjacent vertical bar 36 are aligned, so that adjacent vertical bars 36 are effectively nested together while being spaced apart from one another. Without being bound by theory, it is believed that this configuration allows good air flow past vertical bars 36 while providing a significant degree of protection against allowing splashes past splash guard 34. The vertical nature of vertical bars 36 made from relatively thin material minimizes the obstruction of air flow past splash guard 34, while the sinusoidal wave pattern ensures that any fluid that splashes toward the interior of integrated fault monitor 22 from below is likely to contact vertical bars 36 at some point along its path of travel, and thereby be prevented from entering the interior of integrated fault monitor 22.

In the illustrated embodiment, the vertical bar 36 at each of first and second ends of splash guard 34 does not have a complete sinusoidal shape (i.e. the first end vertical bar 36A comprises only a peak, and the second end vertical bar 36B comprises only a valley as illustrated). However, it will be appreciated by those skilled in the art that these shapes correspond to and form part of the overall wave pattern of splash guard 34.

As described further below with reference to FIGS. 4A, 4B, 4D and 6A-6D, internal fault detector 100 detects transient pressure surges within tank 20. In some embodiments, internal fault detector 100 includes a visual indicator mechanism 102 (an example embodiment of which is shown in FIG. 2A), which is actuated by internal fault detector 100 to provide a visual indication that a transient pressure surge has occurred within transformer 16.

As used herein, "transient pressure surge" means a change in pressure that is greater than approximately 0.25 to 1.5 pounds per square inch within a time period of approximately 5-7 milliseconds. Different embodiments of internal fault detector 100 may have different levels of sensitivity to a transient pressure surge, depending on the desired application.

When there is a breakdown of the insulation surrounding the energized or "active" components of transformer 16, an arc is created. The electric arc dissipates large amounts of energy. The sudden dissipation of energy within tank 20 causes a sharp rise in the pressure within tank 20. Even at levels of short circuit current on the order of 100 amperes, or less, the pressure within tank 20 rises at a rate which is distinctly higher than any other pressure fluctuations that are reasonably expected to occur during normal operation of transformer 16. This rapid pressure rise, i.e. a transient pressure surge, is detected by internal fault detector 100.

Figure 4A:
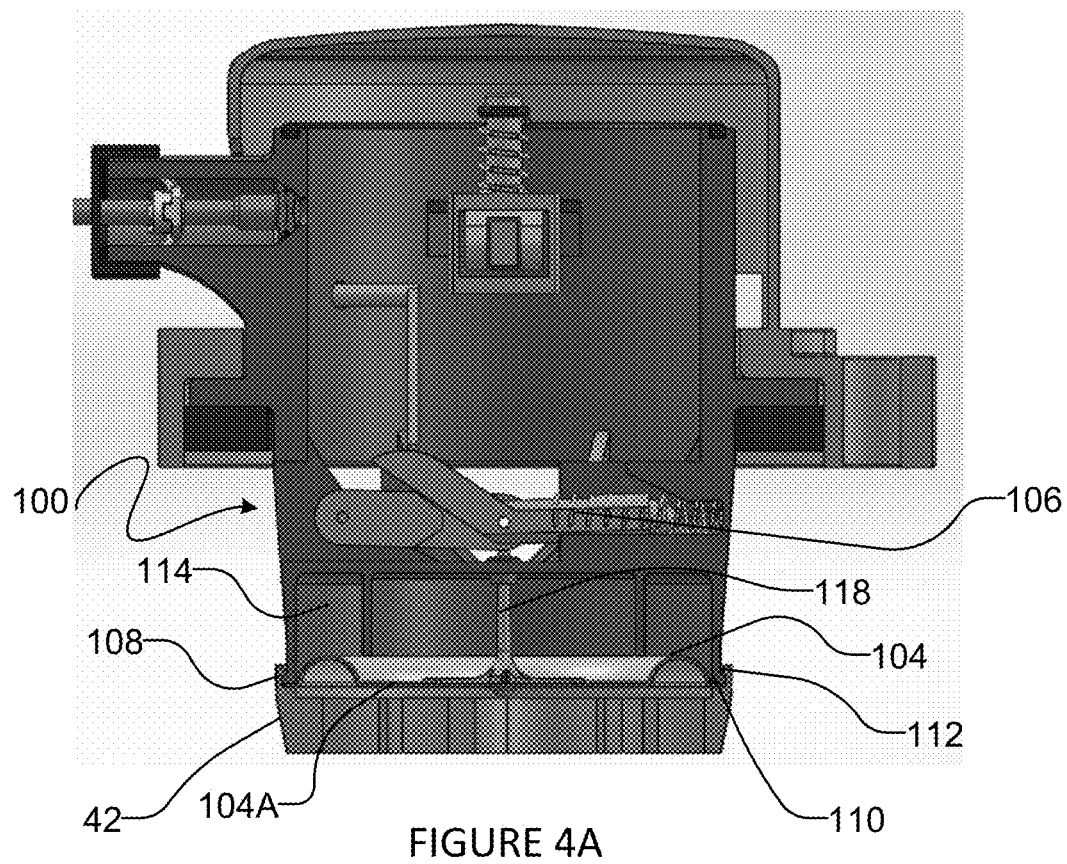
FIGS. 4A, 4B and 4D are cross-sectional views showing components of an example embodiment of an internal fault detector in the armed configuration.
Figure 4B:
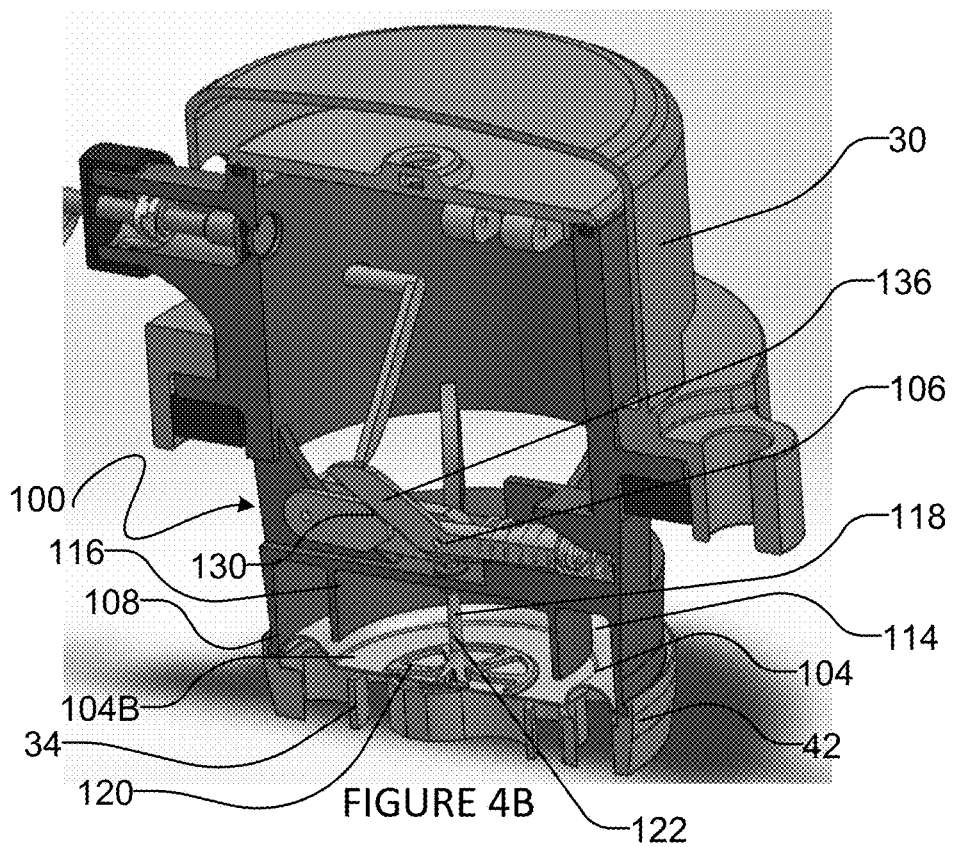
Figure 4C:
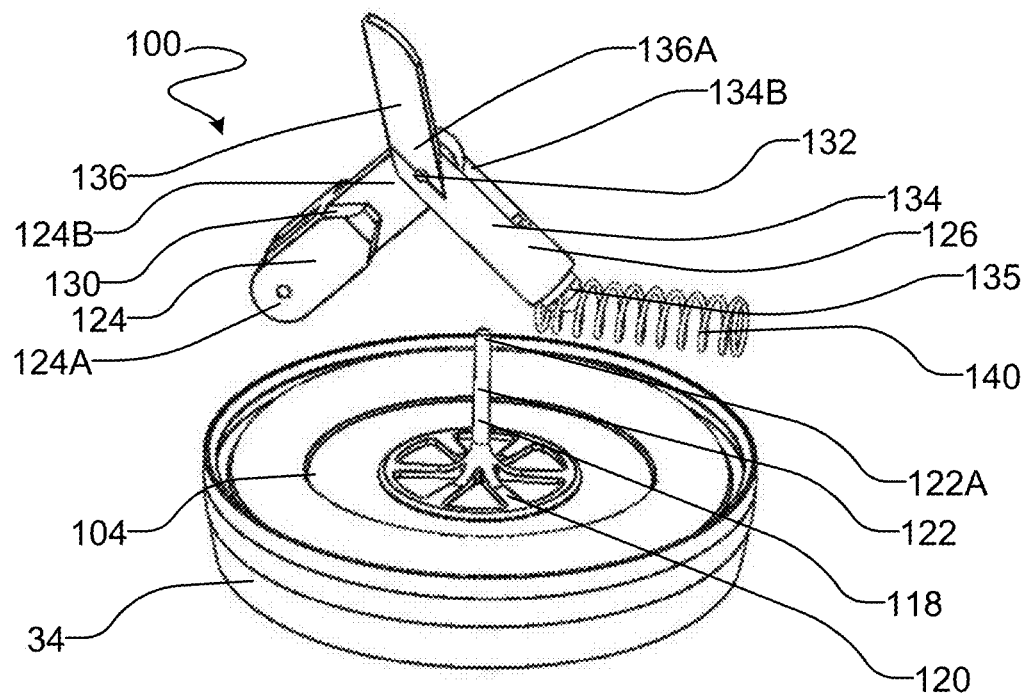
FIG. 4C is an exploded partial view showing components of an example embodiment of an internal fault detector in the triggered configuration.
Figure 4D:
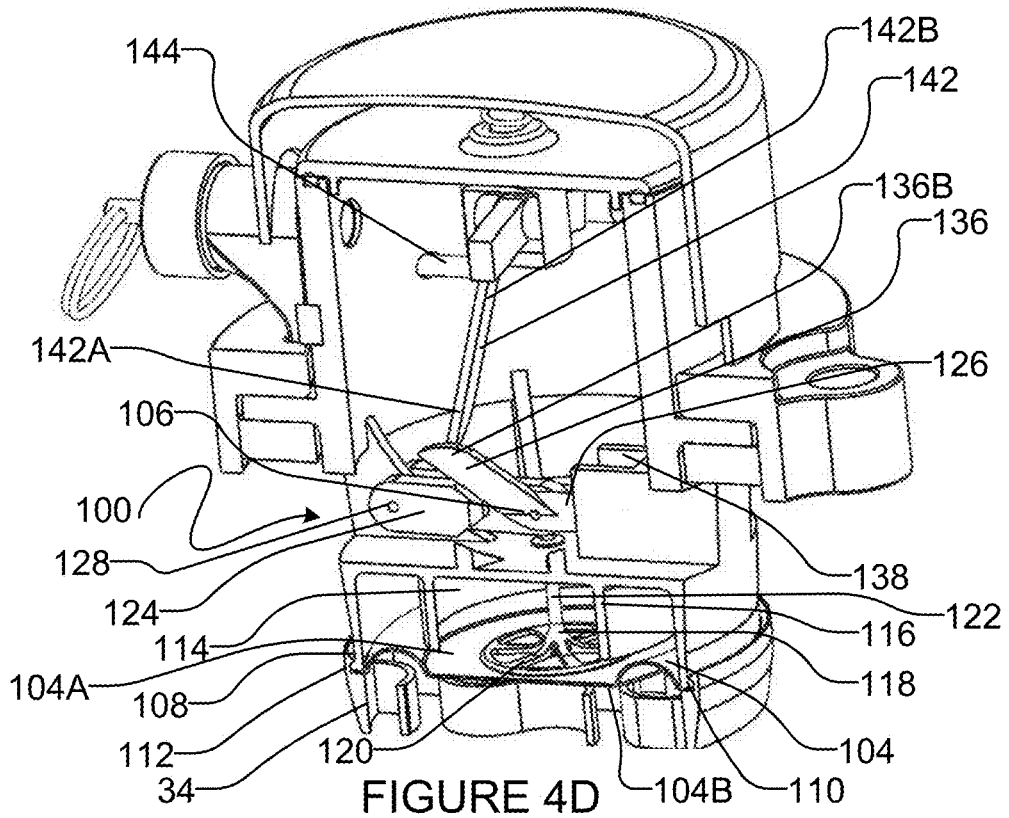

To facilitate detection of transient pressure surges, with reference to FIGS. 4A, 4B and 4D, internal fault detector 100 has a diaphragm 104 that moves in response to a transient pressure surge and a quick release linkage 106 that is released in response to a predetermined degree of movement of diaphragm 104 to actuate a signal that quick release linkage 106 has released.

Figure 5:
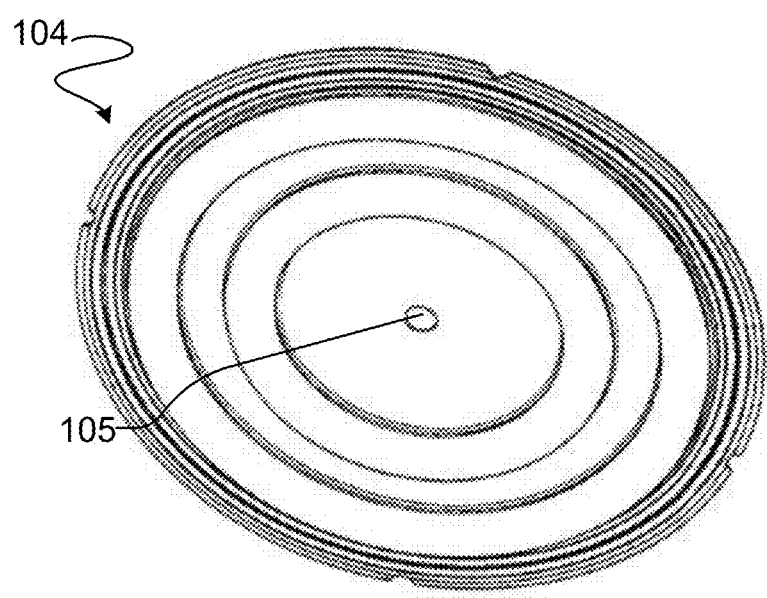
FIG. 5 shows a diaphragm according to one example embodiment.

Diaphragm 104 is engaged around its circumference with the base 108 of housing 30. The engagement between diaphragm 104 and housing 30 provides a generally good seal therebetween, so that movement of air past diaphragm 104 can be restricted to air flow through an aperture 105 (FIG. 5) provided through diaphragm 104, as described below. Any suitable means may be used to secure diaphragm 104 against housing 30, and in some embodiments an O-ring seal (not shown) could be provided between diaphragm 104 and housing 30 to assist in providing a good seal therebetween.

In the illustrated embodiment, base 108 of housing 30 includes a clamping flange 110 that can be engaged in a snap fit with a corresponding clamping flange 112 provided on outer circumference 42 of splash guard 34. The outer circumference of diaphragm 104 is received between clamping flanges 110, 112 to hold diaphragm 104 therebetween. While a snap fit is shown in the illustrated embodiment, any suitable mechanism for securing diaphragm 104 in position could be used, for example, a threaded connection, a clamp mechanism, a bolted connection, or any other suitable coupling method could be used to engage housing 30 and splash guard 34 and hold diaphragm 104 in place.

A first side 104A of diaphragm 104 faces towards the interior of tank 20, and is therefore exposed to the ambient pressure within tank 20. A second side 104B of diaphragm 104 faces towards quick release linkage 106, and defines one edge of a chamber 114. In the illustrated embodiment, the other edges of chamber 114 are defined by housing 30. A small aperture 105 through diaphragm 104 allows air to flow between chamber 114 and the interior of tank 20.

Because air can enter or leave chamber 114 by way of aperture 105, the air pressure within chamber 114 will track relatively slow changes in ambient pressure within tank 20. Such changes might occur, for example, when the temperature within transformer 16 changes. On the other hand, if the pressure within tank 20 increases very suddenly, the air pressure within chamber 114 will take some time to increase because of the small size of aperture 105. In response to a transient pressure surge, diaphragm 104 should move far enough to reliably release quick release linkage 106. During this period, the pressure on face 104A of diaphragm 104 will temporarily significantly exceed the pressure on face 104B. Diaphragm 104 is thus pushed inwardly toward chamber 114, and acts as a pressure sensor capable of releasing quick release linkage 106 in response to the occurrence of a transient pressure surge. The level of movement of diaphragm 104 that is required to release quick release linkage 106 can be selected and adjusted by one skilled in the art, to ensure reliable and reproducible activation of internal fault detector 100, while avoiding triggering of fault detector 100 when there has not been a transient pressure surge (e.g. in response to ambient vibrations). In some embodiments, a vertical deflection of diaphragm 104 of at least 2 mm is required to release quick release linkage 106.

A transient pressure surge would occur, for example, if an electrical fault in the active components of transformer 16 caused an electrical arc within tank 20. Diaphragm 104 should be insensitive to fluctuations in the ambient pressure within tank 20 which occur more slowly than about 1 psi per second, to avoid triggering internal fault detector 100 due to lower changes in internal pressure than would be caused by an internal fault.

In the illustrated embodiment, housing 30 includes a downwardly extending ring 116, that is generally concentric with base 108 of housing 30. In some embodiments, downwardly extending ring 116 helps to prevent damage to diaphragm 104 that could be caused by excessive deflection in response to a transient pressure surge.

Diaphragm 104 should have a reasonably large surface area so that pressure differentials across diaphragm 104 will generate sufficient forces (and therefore sufficient vertical deflection of diaphragm 104) to trigger quick release linkage 106. In some example embodiments, diaphragm 104 has a diameter of 3 inches or more. In other embodiments, smaller diameters may be used for diaphragm 104. For maximum reliability and sensitivity, in fluid-filled electrical devices, diaphragm 104 should face downward toward the surface of the fluid 26 in tank 20 and be generally parallel therewith. In gas-filled electrical devices, diaphragm 104 should preferably be oriented towards the core or coil of the device.

A spindle 118 is provided to transfer movement of diaphragm 104 in response to a transient pressure surge from diaphragm 104 to quick release linkage 106. In the illustrated embodiment, spindle 118 has a diaphragm contacting portion 120 that sits on diaphragm 104 and that moves vertically with diaphragm 104 in response to a transient pressure surge. Diaphragm contacting portion 120 is shaped and configured so that it does not damage diaphragm 104 when diaphragm 104 moves in response to a transient pressure surge. In the illustrated embodiment, diaphragm contacting portion 120 has an outer radial portion that is generally circular with a plurality of inwardly extending arms that contact motion transfer arm 122, so that the force applied by diaphragm 104 to spindle 118 in response to a transient pressure surge is spread across a reasonable surface area of diaphragm 104. The exact shape of diaphragm contacting portion 120 is not critical, and any suitable configuration that transfers movement without damaging diaphragm 104 can be used for diaphragm contacting portion 120, for example, a sheet of suitably resilient material, a plurality of connected concentric rings, or the like.

Spindle 118 also includes a motion transfer arm 122, which projects axially upwardly from diaphragm contacting portion 120 and contacts quick release linkage 106. When diaphragm 104 moves upwardly in response to a transient pressure surge, motion transfer arm 122 transfers that upward motion to quick release linkage 106 to trigger internal fault detector 100.

While in the illustrated embodiment, diaphragm 104 has been illustrated and described as being positioned below quick release linkage 106 with spindle 118 projecting upwardly therefrom to activate quick release linkage 106, in alternative embodiments, diaphragm 104 could be positioned above quick release linkage 106, with a spindle projecting downwardly therefrom and being secured to a component of quick release linkage 106, to activate quick release linkage 106 by pulling upwardly thereon, rather than pushing upwardly thereon as in the described example embodiment.

Figure 6A:
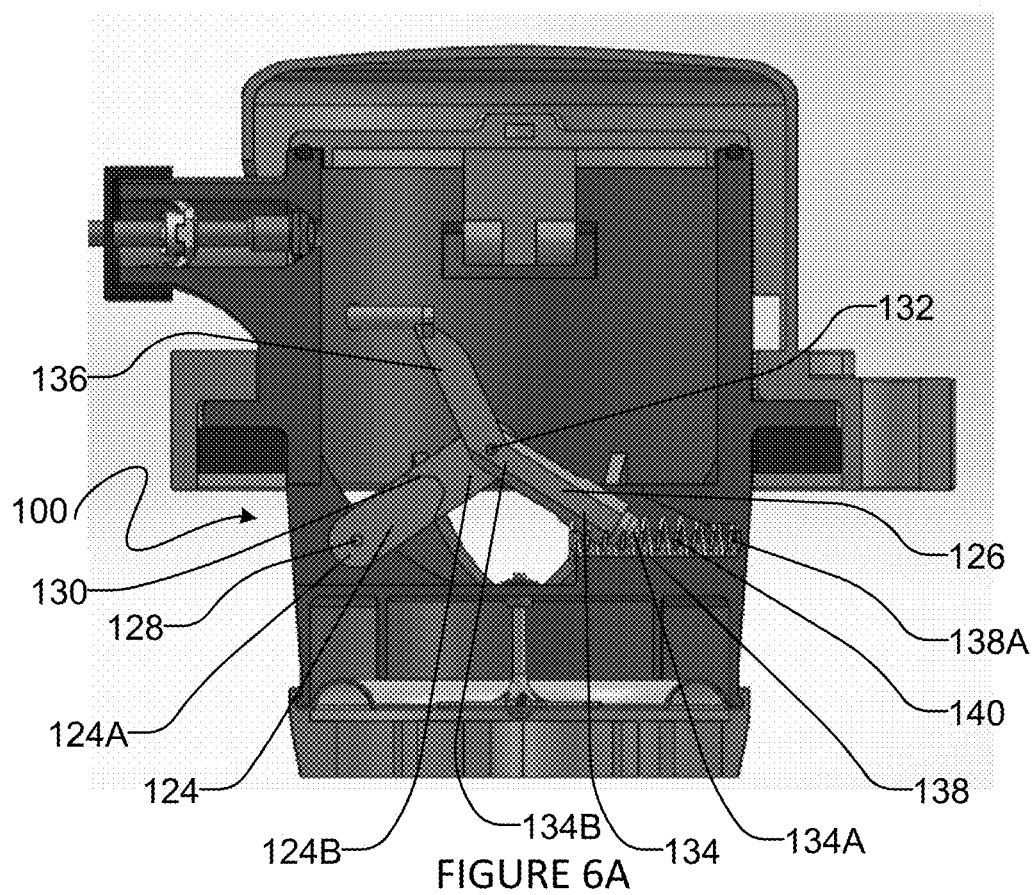
FIGS. 6A and 6B are cross-sectional views showing components of an example embodiment of an internal fault detector in the triggered position.
Figure 6B:
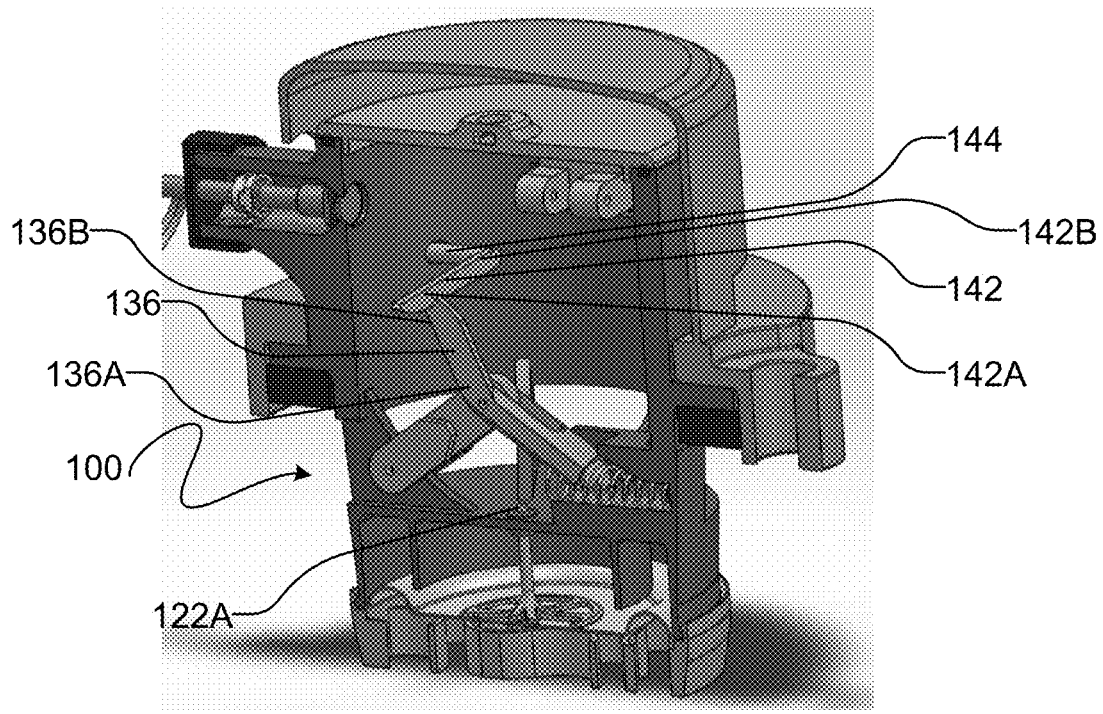
Figure 6C:
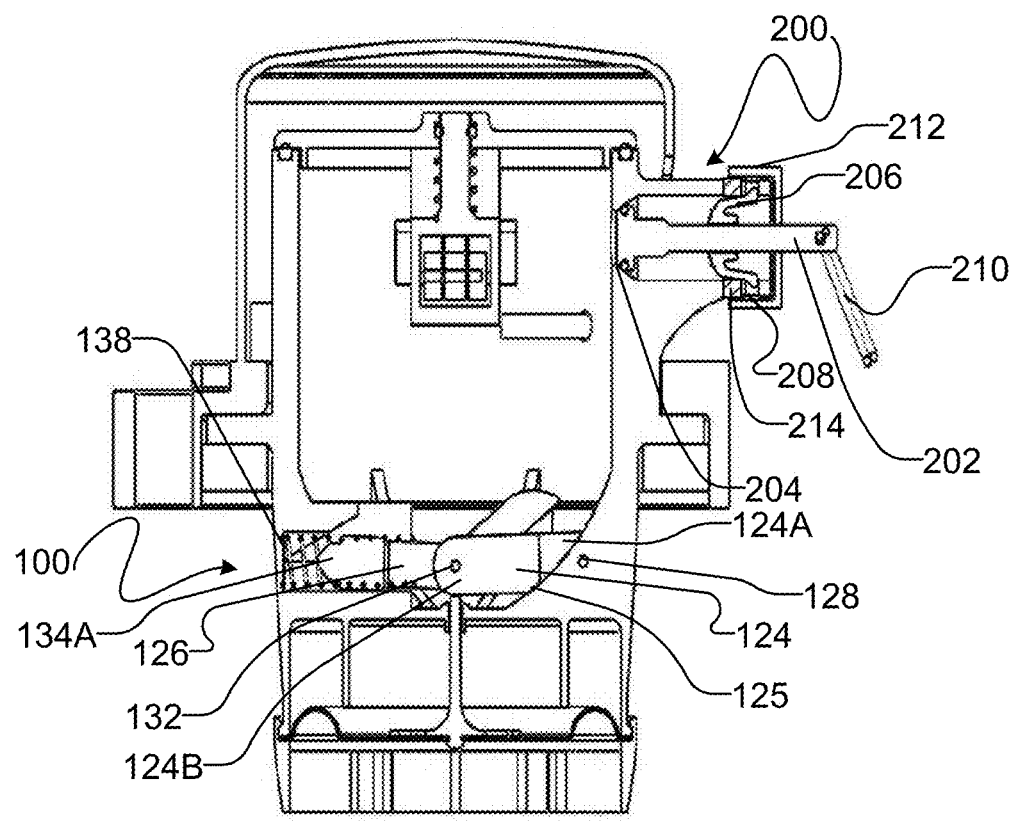
FIGS. 6C and 6D are further cross-sectional views showing a different view of components of an example embodiment of an internal fault detector in the armed and triggered positions, respectively, and also showing an example embodiment of a pressure relief valve.
Figure 6D:
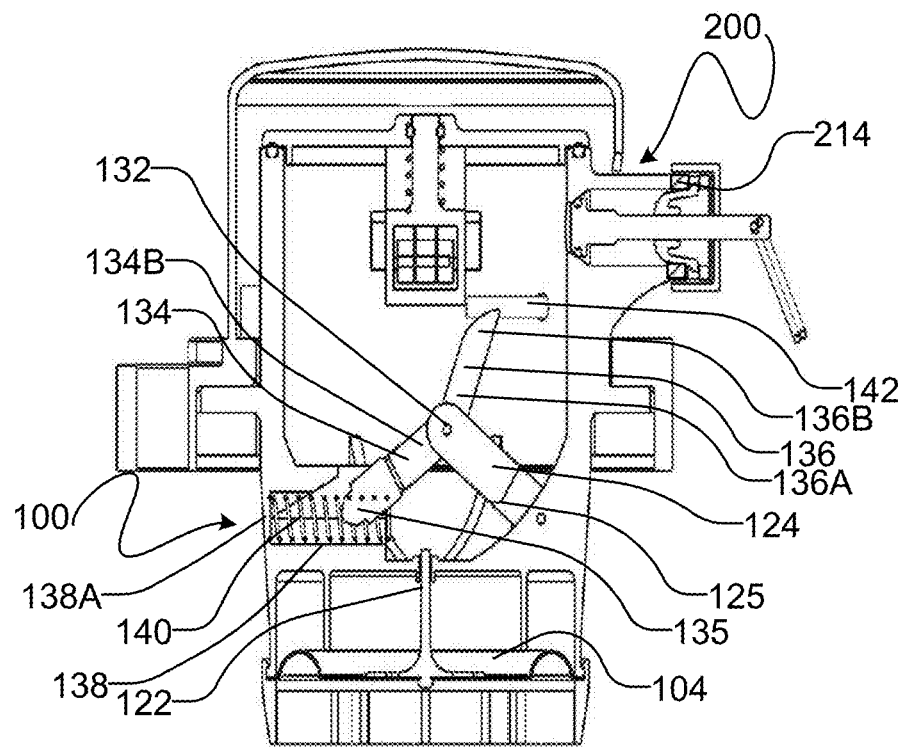

FIGS. 4A, 4B, 4D and 6C show quick release linkage 106 in the armed configuration. FIG. 4C shows an exploded partial view of quick release linkage 106 in the triggered configuration to better show the components thereof. FIGS. 6A, 6B and 6D show quick release linkage 106 in the triggered configuration, after activation by movement of motion transfer arm 122. In the illustrated embodiment, quick release linkage 106 is a self-locking two-bar linkage that is rigid when set in the locked (or armed) position. Toggle action is used to move quick release linkage 106 between the armed position and the triggered position. Once quick release linkage 106 is placed in the over-center locked (or armed) position, it cannot be released unless the linkage is released. Upward movement of diaphragm 104 is transferred to quick release linkage 106 to release the linkage, thereby activating internal fault detector 100.

Figure 7A:
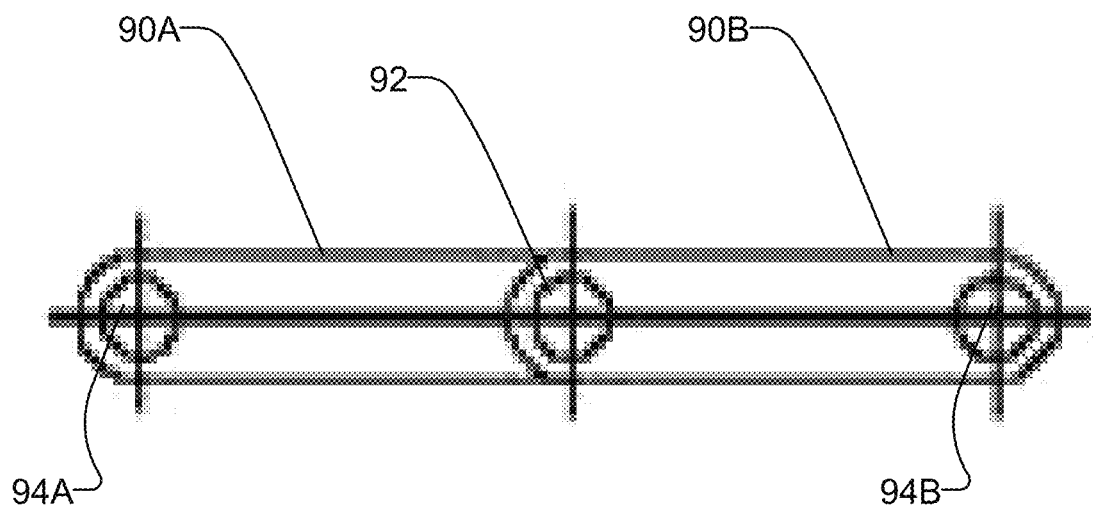
FIGS. 7A, 7B and 7C are schematic diagrams illustrating the toggle action principle.
Figure 7B:
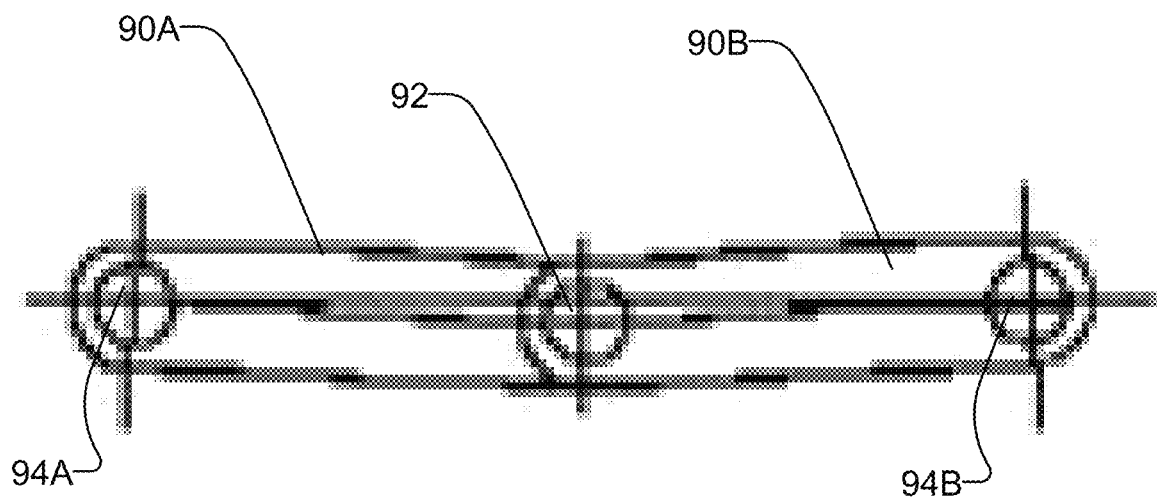
Figure 7C:
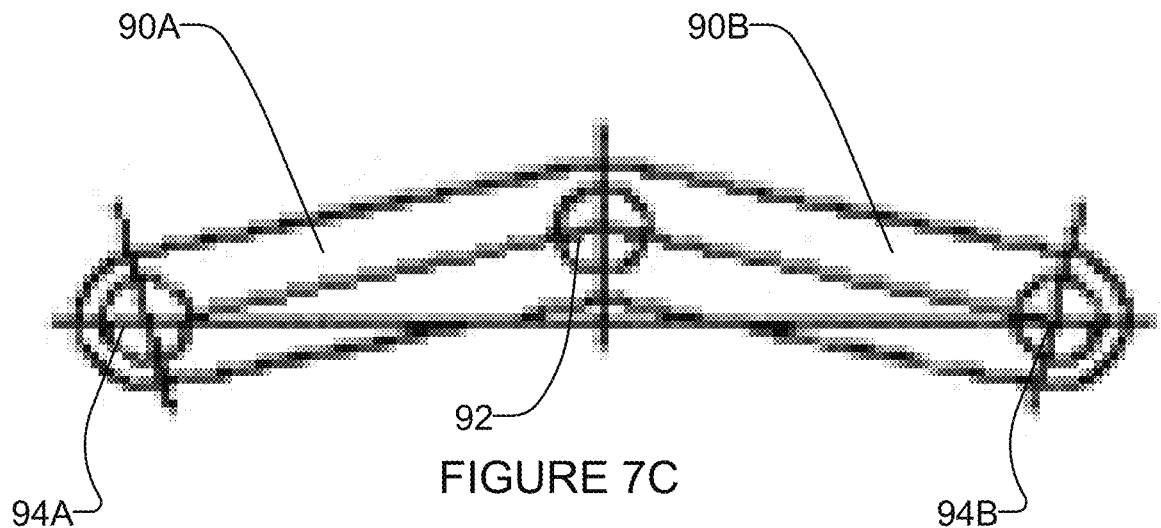

FIGS. 7A, 7B and 7C illustrate schematically the toggle action principle that is used in the self-locking linkages used in quick release linkage 106 and self-locking linkage 302 (described below) of some embodiments of the present invention. Linkages 106 and 302 are two-bar linkages that are self-locking, i.e. the rotation of the linkage is limited in one direction. Once this limit is reached the linkage becomes fully constrained and will not move unless a force is applied in the opposite direction at or near the central rotation point of the linkage.

Generally speaking, each linkage comprises two generally longitudinally aligned bars 90A, 90B that are connected by a pivot point 92 and have further pivot points (labelled as 94A, 94B) at the outside end of each of bars 90A, 90B. When each linkage is pushed past a center position in which the two bars are longitudinally aligned (shown in FIG. 7A), the linkage is placed in a clamped or locked position (shown in FIG. 7B), in which pivot points 94A and 94B sit in one plane, while bars 90A, 90B are slightly angled with respect to one another (angled downwardly in the inward direction in the illustrated view, so that pivot point 92 sits below pivot points 94A and 94B). In the locked position, further rotation is limited by the structure of the linkage, and the linkage can resist compressive forces applied to bars 90A, 90B in the longitudinal direction, preventing relative movement of pivot points 94A, 94B towards one another by an applied compressive force. In the illustrated embodiments, the prevention of rotation of the linkage in the locked position is achieved by having bars 90A, 90B contact each other in a specific orientation to achieve a sufficiently rigid locked position, while requiring a predetermined amount of force to move the linkage to the unlocked (i.e. triggered) position.

When each linkage is moved in the opposite direction, upwardly of centre in the illustrated embodiment, the linkage is placed in an unclamped position (shown in FIG. 7C), in which pivot points 94A and 94B sit in one plane, while bars 90A, 90B are slightly angled in the opposite direction with respect to one another (angled upwardly in the illustrated view, so that pivot point 92 sits above pivot points 94A and 94B). In the unclamped position, the linkage cannot resist compressive forces applied longitudinally to bars 90A, 90B, and such an applied compressive force will result in movement of pivot points 94A, 94B towards one another as bars 90A, 90B rotate towards one another about pivot point 92.

In the illustrated embodiment, quick release linkage 106 has a restraining arm 124 and an activation arm 126. Restraining arm 124 and activation arm 126 are pivotally coupled together, so that they can move between the armed configuration and the triggered configuration.

Restraining arm 124 is pivotally coupled at a first end 124A to housing 30 in any suitable manner. In the illustrated embodiment, restraining arm 124 is pivotally coupled to housing 30 by engagement of a pin 128 through aligned apertures in first end 124A and housing 30. In the locked (i.e. armed) configuration, an angled retaining surface 125 of first end 124A, provided on an inside portion of the wishbone connection of first end 124A, contacts a portion of housing 30 (as shown in FIG. 6C). Angled retaining surface 125 prevents further rotation of retaining arm 124 (and hence of quick release linkage 106) past the locked (i.e. armed) position. While angled retaining surface 125 has been described as the structure that prevents further rotation of retaining arm 124 in this example embodiment, those skilled in the art will recognize that a similar structure could be provided anywhere on linkage 106, so long as it acts to prevent further movement of linkage 106 past the locked (i.e. armed) configuration.

Restraining arm 124 is pivotally coupled at a second end 124B to activation arm 126 in any suitable manner. In the illustrated embodiment, restraining arm 124 is pivotally coupled to activation arm 126 by engagement of a pin 132 through aligned apertures on restraining arm 124 and activation arm 126. To facilitate this arrangement, in the illustrated embodiment, second end 134B of sliding portion 134 of activation arm 126 (described below) is provided with a Y-shape, to provide a slot for receiving second end 124B of restraining arm 124. Restraining arm 124 is also provided with an angled sliding surface 130. In alternative embodiments, angled sliding surface 130 could be positioned and configured to be the structure which prevents quick release linkage 106 from moving past the locked (i.e. armed) position, rather than angled retaining surface 125.

In the illustrated embodiment, activation arm 126 has a sliding portion 134 and an angled activator portion 136. In the armed configuration, a first end 134A of sliding portion 134 sits within an activation channel 138 formed within housing 30. Sliding portion 134 extends in generally the same direction as restraining arm 124 when quick release linkage 106 is in the armed configuration, i.e. so that sliding portion 134 and restraining arm 124 are generally axially aligned, although one skilled in the art will appreciate that each of sliding portion 134 and restraining arm 124 are angled slightly downwardly in the inward direction in the locked configuration.

A spring 140 contacts sliding portion 134 at first end 134A of sliding portion 134. In the illustrated embodiment, first end 134A of sliding portion 134 has a generally cylindrical projecting nob 135 formed thereon. The spring 140 sits within activation channel 138 and extends between first end 134A and a base 138A of the activation channel. In the illustrated embodiment, projecting nob 135 sits within the coil of spring 140, to help keep spring 140 axially aligned with activation arm 126 when quick release linkage 106 is in the armed position. Spring 140 urges sliding portion 134 inwardly towards the centre of housing 30, away from base 138A of the activation channel.

When quick release linkage 106 is placed in the locked (i.e. armed) position, angled retaining surface 125 is placed in contact with a portion of housing 30, thereby preventing further rotation of linkage 106 past the locked position. The extension force applied by spring 140 pushes angled activator portion 136 against restraining arm 124, maintaining the contact between angled retaining surface 125 and housing 30, thereby securing quick release linkage 106 in the locked (i.e. armed) position.

The degree of force applied by spring 140 determines how easily quick release linkage 106 can be moved into the unlocked (i.e. triggered) position: the stronger the force applied by spring 140, the more difficult it will be to move quick release linkage 106 to the unlocked (i.e. triggered) position. If no force is applied by spring 140, then vibrations or other ambient forces experienced by tank 20 might be sufficient to move quick release linkage 106 from the locked (i.e. armed) position to the unlocked (i.e. triggered position), which would reflect a false positive triggering of internal fault detector 100. Thus, the sensitivity of internal fault detector 100 can be modulated by adjusting the properties of spring 140 to apply a desired amount of force to hold angled retaining surface 125 in the locked position.

Any suitable spring mechanism can be used to provide spring 140. In the illustrated embodiment, spring 140 is a coil spring.

With reference to FIGS. 6A and 6B, quick release linkage 106 is actuated from the locked or clamped (i.e. armed) position to the unclamped (i.e. triggered) position by the application of a predetermined degree of upward movement of motion transfer arm 122 of spindle 118, caused by the upward movement of diaphragm 104 during a transient pressure surge. In some embodiments, an upward vertical deflection of diaphragm 104 of at least 2 mm is required to release (i.e. trigger) quick release linkage 106; however, the degree of upward deflection can be adjusted by one skilled in the art to balance increased sensitivity (lower vertical deflection required to release quick release linkage 106) with avoidance of false positives, and could also be adjusted based on the configuration of other components of internal fault detector 100.

During a transient pressure surge, the top portion 122A of motion transfer arm 122 applies an upward force to second end 124B of restraining arm 124. (In alternative embodiments, the upward force could be applied to second end 134B of sliding portion 134 of activation arm 126). This force causes restraining arm 124 to pivot upwardly about pin 128, causing second ends 124B and 134B of restraining arm 124 and sliding portion 134, respectively, and pin 132 to move upwardly, releasing linkage 106 from the locked position.

The extension force applied by spring 140 against first end 134A of sliding portion 134 can thus cause first end 134A to slide inwardly within activation channel 138 and move further towards first end 124A of restraining arm 124, so that restraining arm 124 and sliding portion 134 of activation arm 126 pivot about pin 132, forcing second ends 124B and 134B to move upwardly. Thus, spring 140 plays a dual role in both maintaining quick release linkage 106 in the locked configuration (i.e. in maintaining internal fault detector 100 in the armed configuration), and in activating internal fault detector 100.

Upward motion of second end 134B of sliding portion 134 causes activator portion 136 of activation arm 126 to move upwardly within housing 30. Activator portion 136 is in contact with sliding portion 134 at first end 136A of activator portion 136. In the illustrated embodiment, activator portion 136 and sliding portion 134 are integrally formed as one piece, but in other embodiments, activator portion 136 and sliding portion 134 could be formed as separate pieces coupled together in any suitable manner.

Second end 136B of activator portion 136 is in contact with an indication mechanism. The indication mechanism provides a signal that internal fault detector 100 has been actuated. Any suitable indication mechanism could be used, for example a mechanical indication mechanism such as a flag that is extended from housing 30 or a coloured portion that is rendered visible when internal fault detector 100 has been actuated. In some embodiments, the indication mechanism could be an electronic indication mechanism, for example the transmission of a signal that is received by wired or wireless means to provide notification that internal fault detector 100 has been actuated. In some embodiments, a transmitter 17 (FIG. 1A) is provided on transformer 16 to transmit a signal, such as a radio signal, that internal fault detector 100 has been actuated. In some embodiments, both a mechanical indication mechanism and an electronic indication mechanism are used.

In the illustrated embodiment, an exemplary mechanical indication mechanism is used to provide a visual signal that internal fault detector 100 has been actuated. Second end 136B of activator portion 136 is contact with a rotatable member 142 at or near its first end 142A. The second end 142B of rotatable member 142 is coupled to or integrally formed with a shaft 144. Rotation of shaft 144 as activator portion 136 is rotated upwardly within housing 30 causes a visible signal 102 on the outside of integrated fault monitor 22. For example, in some embodiments, rotation of shaft 144 causes a brightly coloured portion provided at the outside end of shaft 144 to rotate from a non-visible to a visible position. Personnel inspecting transformer 16 are thus provided with a visible indication that internal fault detector 100 has been triggered.

Adjustment of normal fluctuations in the internal pressure within tank 20 is handled by a pressure relief valve 200. Any suitable pressure relief valve can be used to provide pressure relief valve 200. In the illustrated embodiment, pressure relief valve 200 is generally similar to that described in Patent Cooperation Treaty publication No. WO 2011/153604, which is incorporated herein by reference, except that pressure relief valve 200 is entirely separate from internal fault detector 100 (i.e. components of the two devices are not shared and the two occupy separate spaces within integrated fault monitor 22).

With reference to FIGS. 6C and 6D, in the illustrated embodiment, pressure relief valve 200 has an axially movable valve member 202 that is biased into engagement with a valve seat 204 by a low rate spring (not shown). If the ambient pressure in tank 20 exceeds the atmospheric pressure outside of tank 20, then there is a net outward force on the end of valve member 202. When this force exceeds a predetermined value, for example, a force corresponding to a pressure differential of 5 psi, 7 psi or 10 psi, the spring will compress and allow gases to vent from tank 20 past valve member 202.

Valve member 202 protrudes through and is in sliding engagement with a spring retainer 206 that is engaged by a plurality of feet with receiving notches 208 formed in housing 30. A ring 210 or other graspable member is provided at the outer end of valve member 202 to facilitate manual venting of tank 20, for example by having a technician pull outwardly on ring 210 to release valve member 202.

If the pressure rises to a value which is greater than the set point of pressure relief valve 200, then pressure relief valve 200 opens until the pressure has been relieved. The pressure within tank 20 may rise to a level capable of opening pressure relief valve 34 as a result of normal fluctuations in ambient temperature and loading. Service personnel may also manually operate pressure relief valve 200, to equalize the ambient pressure inside tank 20 with the air pressure outside of tank 20.

In some embodiments, pressure relief valve 200 is configured to provide an indication that it has been activated. In some embodiments, the indication is a manual indication. In some embodiments, the indication is an electronic indication.

In the illustrated embodiment, pressure relief valve 200 is configured to provide a manual indication that it has been actuated. Pressure relief valve 200 is initially covered by a cover 212. An outer portion of the protruding neck of pressure relief valve 200 can be provided with a brightly coloured region 214 (illustrated schematically in FIGS. 6C and 6D). Cover 212 initially covers brightly coloured region 214, so that it cannot be seen from outside pressure relief valve 200. When pressure relief valve 200 is activated, cover 212 is moved outwardly by the movement of valve member 202, thereby exposing brightly coloured region 214. A person making a visual inspection of tank 20 can then readily see that pressure relief valve 200 has been activated at some point in time.

A sudden pressure relief device 300 is provided in some embodiments of integrated fault monitor 22 to help mitigate failures of an electrical device such as transformer 16. In the event of a failure, gases and hot oil that are present within transformer 16 are directed to a safe dispersal location through sudden pressure relief device 300, rather than for example causing an explosion of transformer 16 and concomitant dispersal of gases and hot oil indiscriminately into the surrounding atmosphere.

Figure 8A:
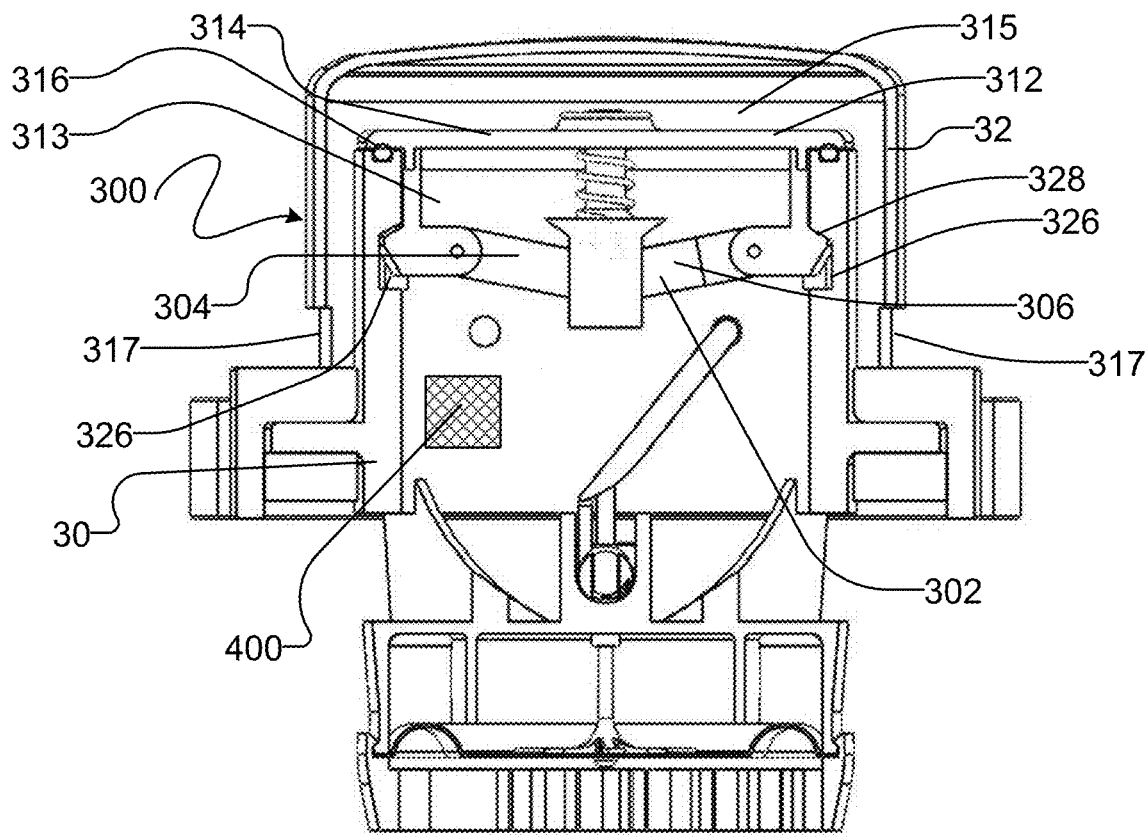
FIGS. 8A and 8B are cross-sectional views showing example embodiments of a sudden pressure relief device in the armed position.
Figure 8B:
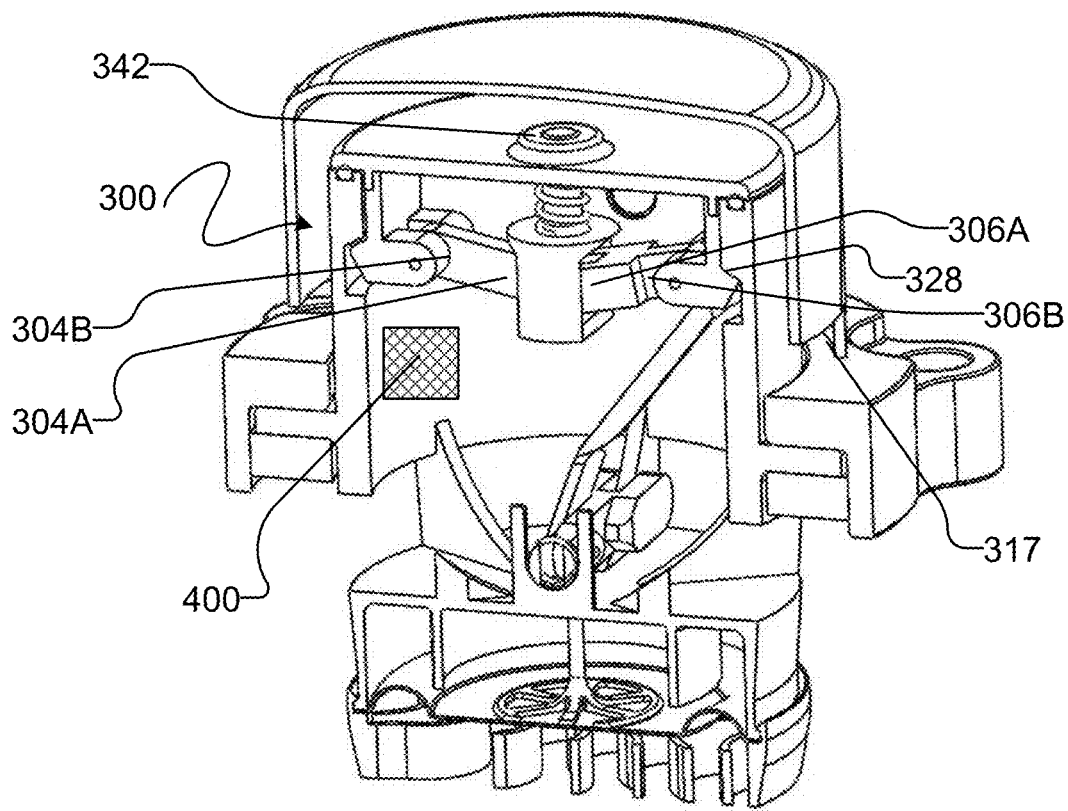
Figure 9A:
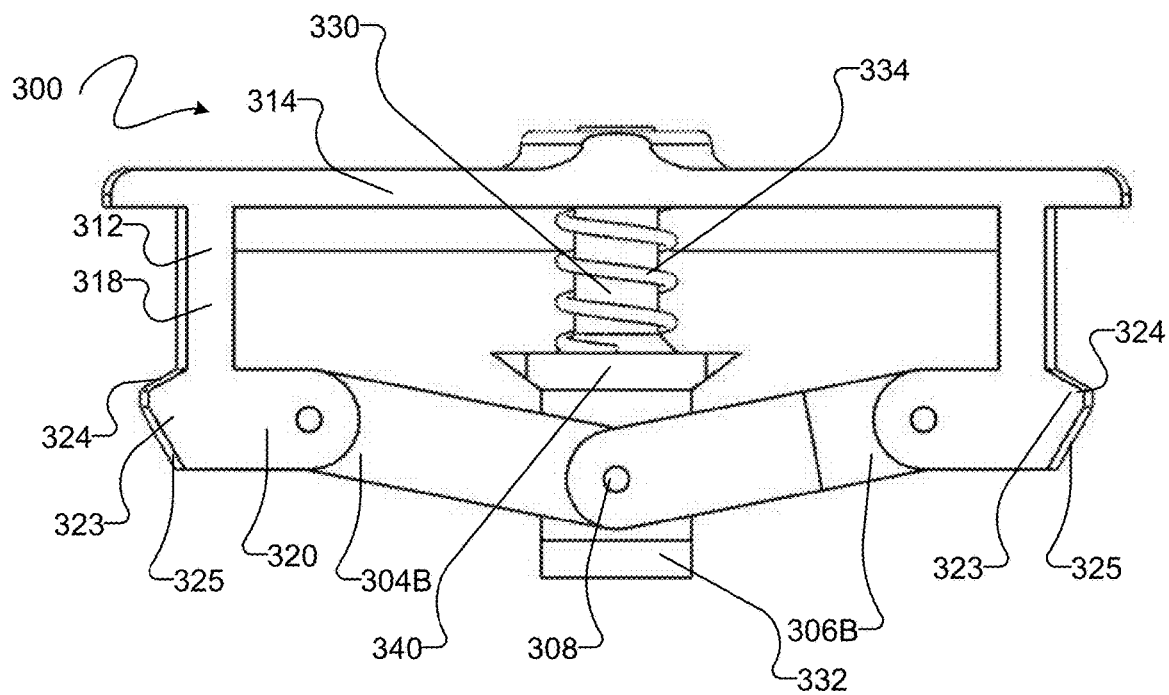
FIGS. 9A and 9B are partial cross-sectional views of an example embodiment of a sudden pressure relief device in the armed configuration.
Figure 9B:
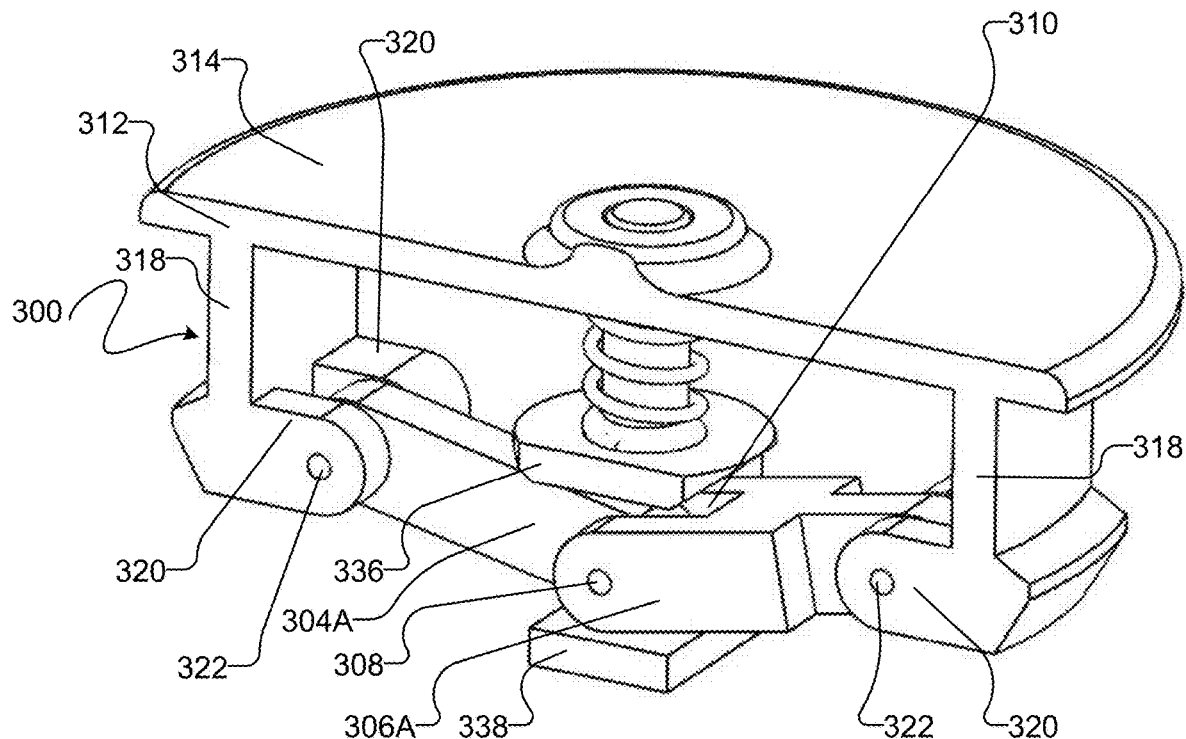
Figure 9C:
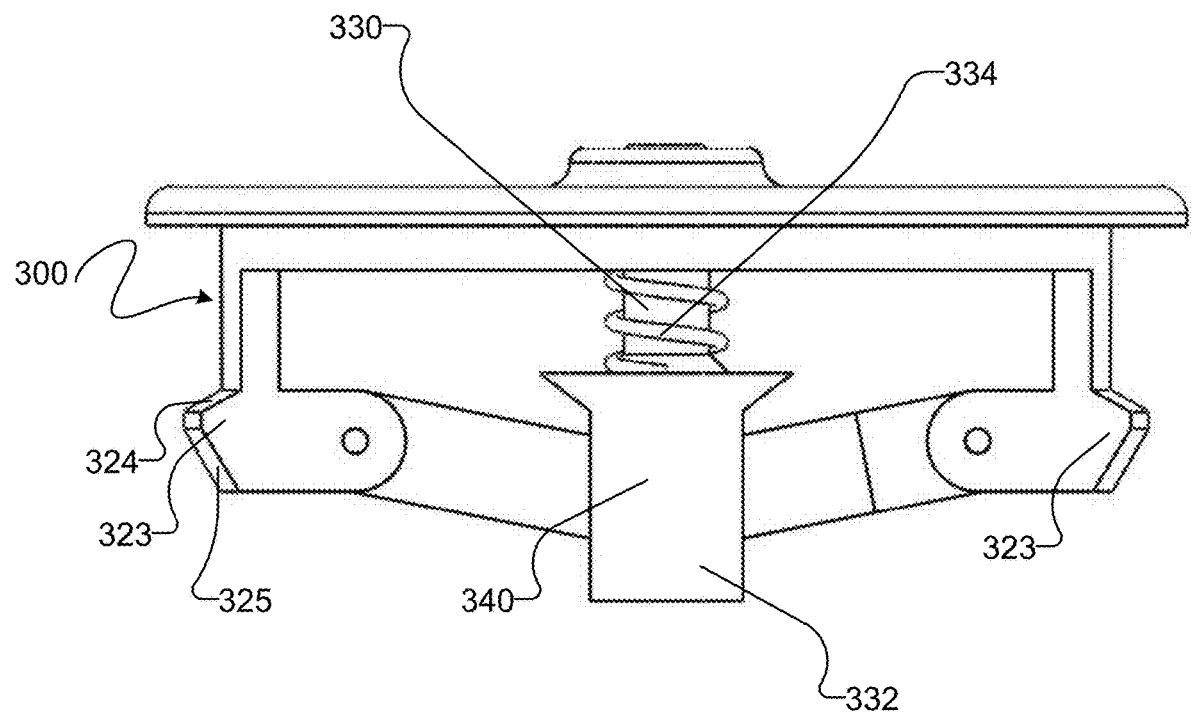
FIG. 9C is a partial cross-sectional view of an example embodiment of a sudden pressure relief device in the armed configuration, showing some movement of the regulating shaft thereof, as would occur during normal pressure fluctuations within an electrical device.
Figure 9D:
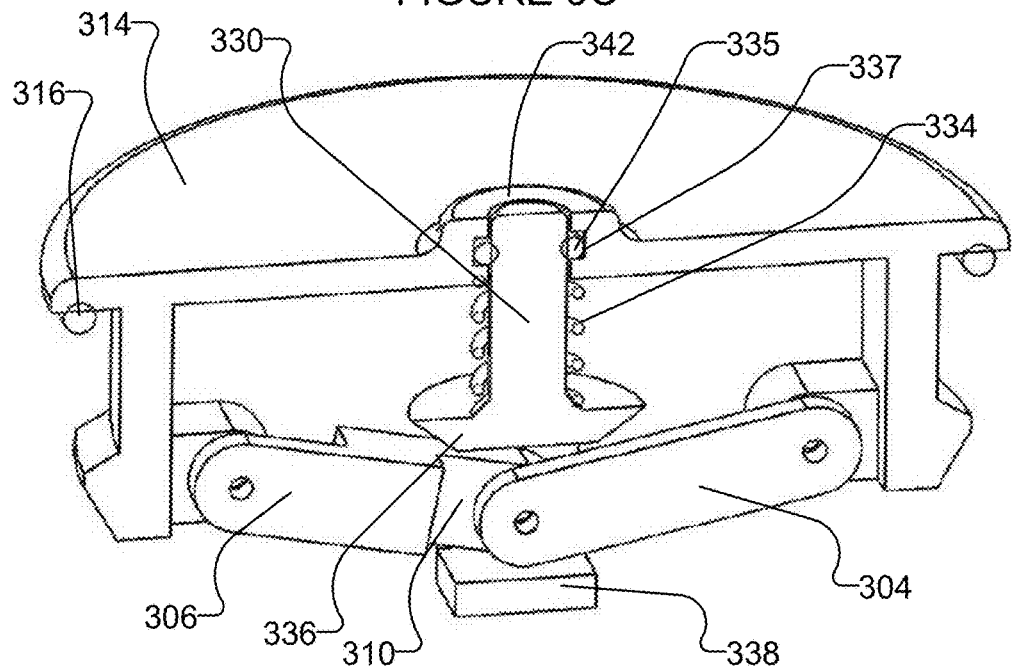
FIG. 9D is a partial cross-sectional view of an example embodiment of a sudden pressure relief device in the armed configuration, showing a seal provided between the regulating shaft and the top plate thereof.
Figure 10A:
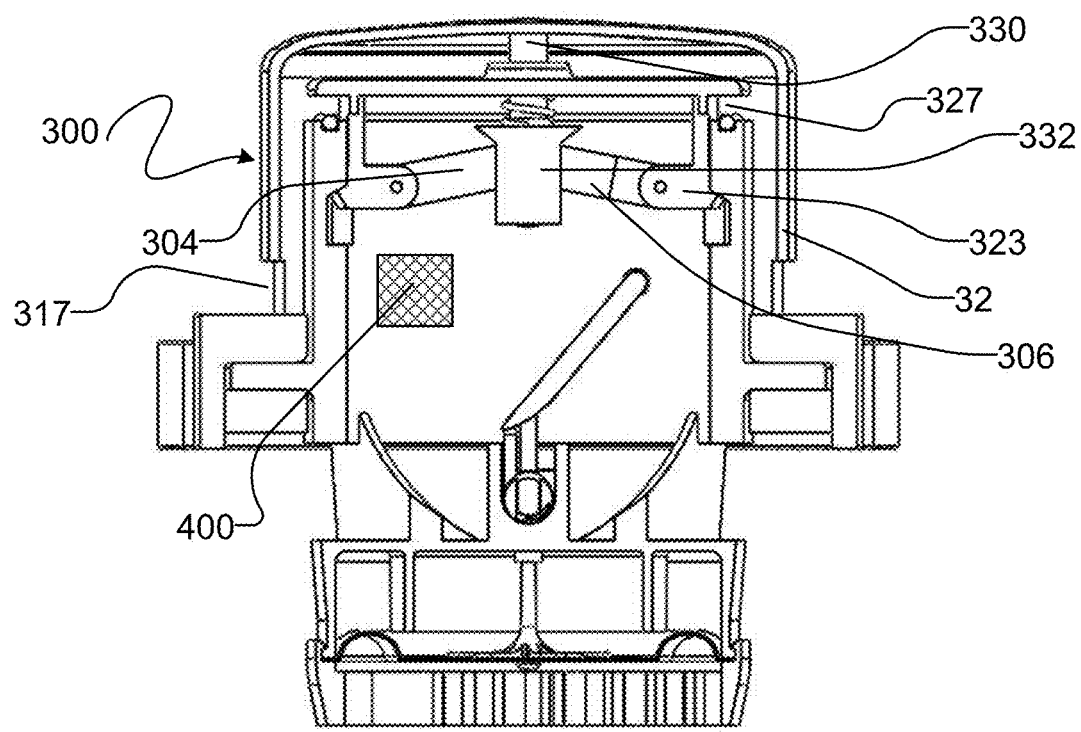
FIGS. 10A and 10B are cross-sectional views showing example embodiments of a sudden pressure relief device in the triggered position to allow venting of gases.
Figure 10B:
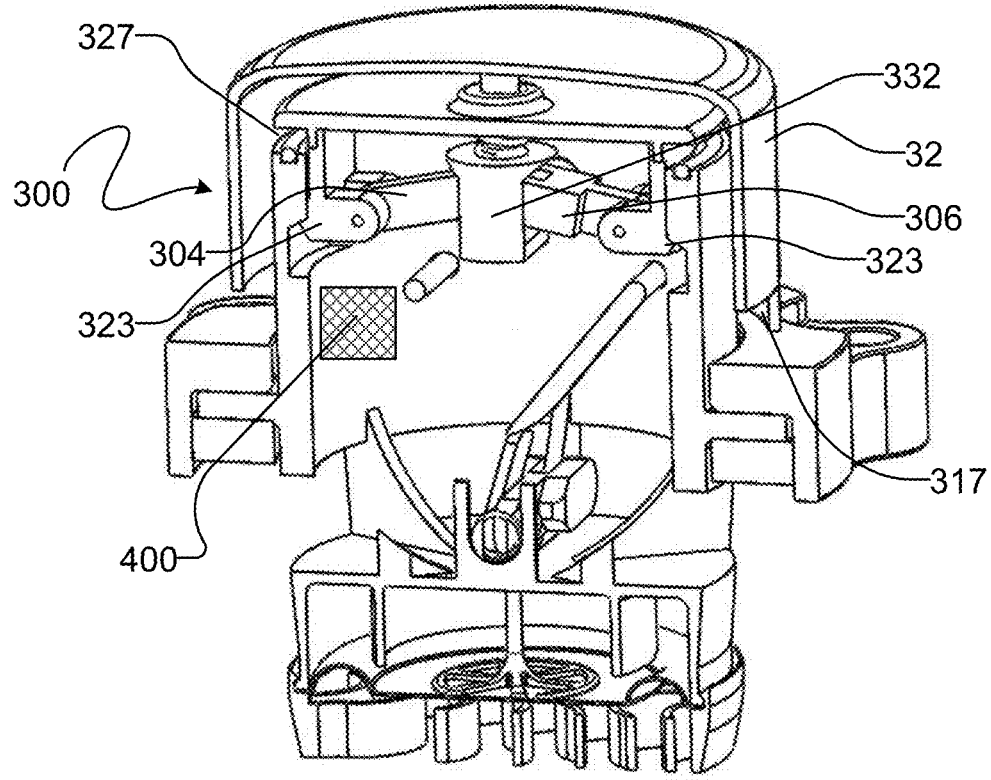
Figure 11A:
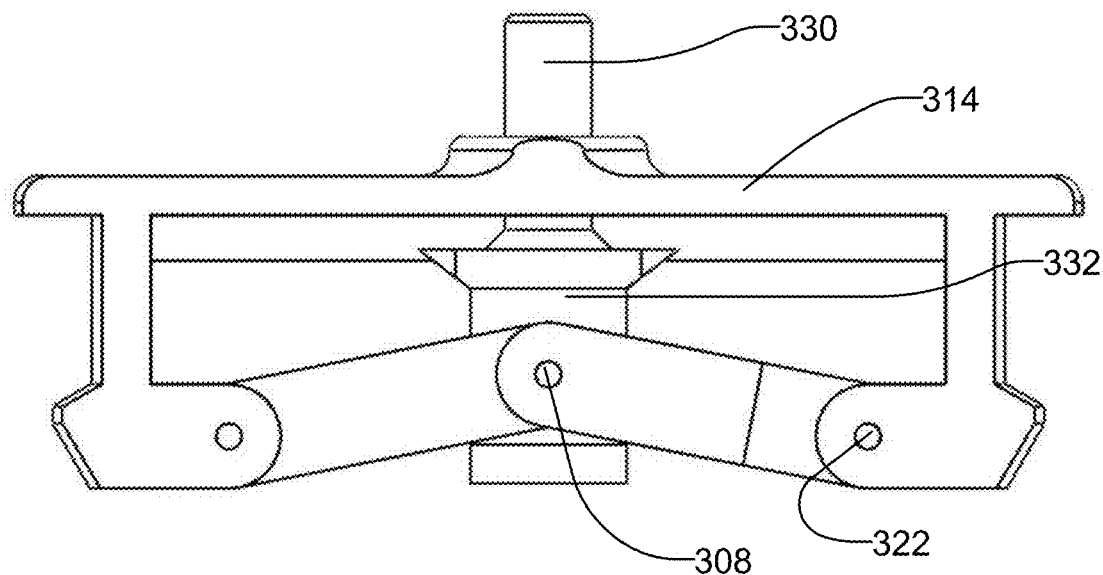
FIGS. 11A and 11B are partial cross-sectional views showing more detail of the components of example embodiments of a sudden pressure relief device in the triggered position.
Figure 11B:
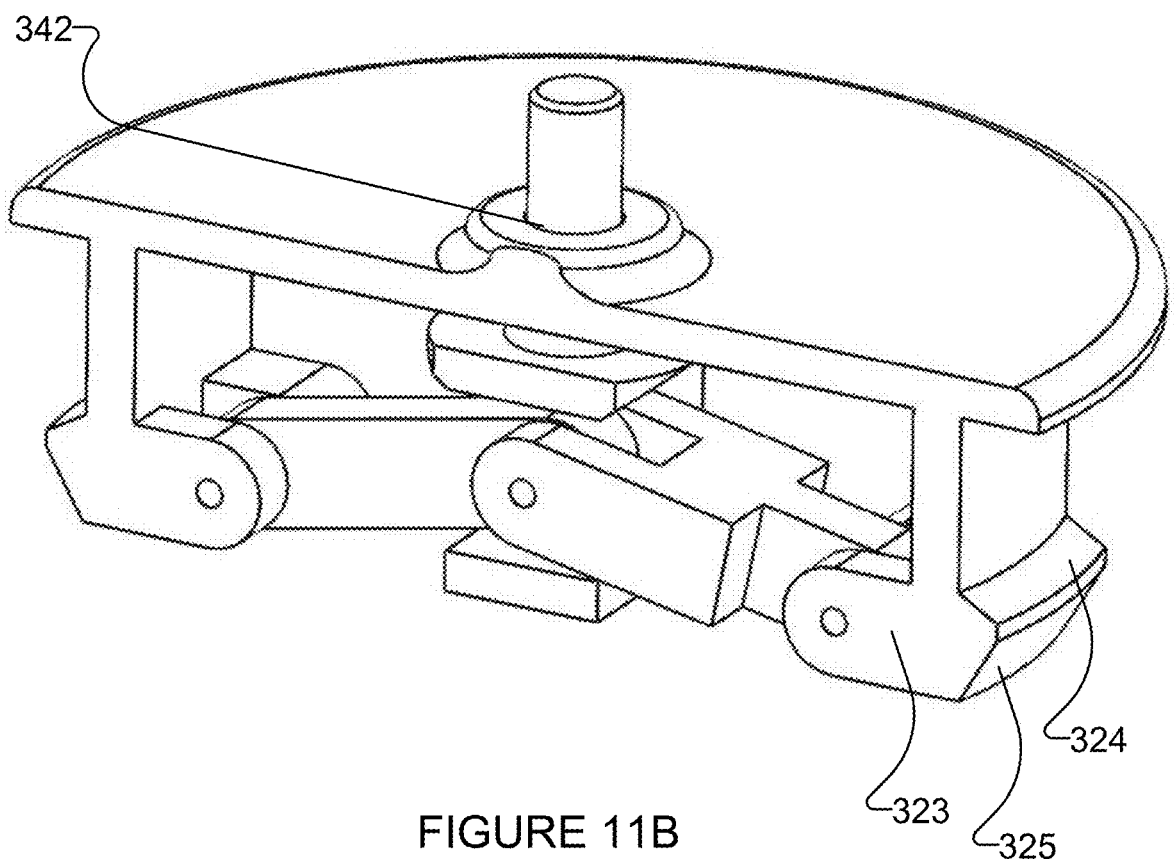

An example embodiment of a sudden pressure relief device 300 is illustrated in the armed position in FIGS. 8A and 8B, and in the triggered position in FIGS. 10A and 10B. FIGS. 9A, 9B, 9C and 9D show further details of sudden pressure relief device 300 in the armed position, while FIGS. 11A and 11B show further details of sudden pressure relief device 300 in the triggered position. Sudden pressure relief device 300 has a self-locking two bar linkage 302 that is rigid when set in the armed position. Toggle action is used to move self-locking linkage 302 between the armed position and the triggered position.

Self-locking linkage 302 has two bars 304, 306 that are generally longitudinally aligned (although angled slightly inwardly and downwardly) when linkage 302 is in the locked configuration. Bars 304, 306 are pivotally engaged with one another at first ends 304A, 306A thereof. In the illustrated embodiment, bars 304, 306 are pivotally engaged by insertion of a pin 308 (FIGS. 9A and 9B) through a series of aligned apertures in first ends 304A, 306A. In the illustrated embodiment, first end 306A of bar 306 is provided with a Y-shape (best seen in FIG. 9B), so that a channel 310 is provided in bar 306 for receiving first end 304A of bar 304 therein to allow for the series of aligned apertures through which pin 308 is inserted.

Second ends 304B, 306B of bars 304, 306 are pivotally engaged with a support structure 312 of sudden pressure relief device 300. Support structure 312 has a top plate 314 that is sealingly engaged with an upper portion of housing 30 to define an inner chamber 313 bounded by housing 30, splash guard 36, and top plate 314. In the illustrated embodiment, the upper portion of housing 30 is generally circular in shape, and the outer circumference of top plate 314 is generally circular, and the outer circumferences of housing 30 and top plate 314 are in sealing engagement. In the illustrated embodiment, an O-ring seal 316 is provided to enhance the seal between housing 30 and top plate 314. Because air can pass through splash guard 36, the pressure within inner chamber 313 will correspond to the pressure within the electrical device in which integrated fault monitor 22 is installed.

An outer chamber 315 is defined between cap 32 and the combined structure of housing 30 and top plate 314. Outer chamber 315 is open to the external atmosphere, i.e. the atmosphere outside the electrical device such as transformer 16 in which integrated fault monitor 22 is installed. In the illustrated embodiment, outer chamber 315 is open to the external atmosphere via one or more apertures 317 provided through cap 32.

Support structure 312 has two downwardly depending snap arms 318 for supporting self-locking linkage 302. A pair of inwardly extending projecting arms 320 are provided at the bottom portion of each of snap arms 318, and second ends 304B, 306B of bars 304, 306 are inserted between each pair of projecting arms 320. In the illustrated embodiment, second ends 304B, 306B are pivotally engaged with support structure 312 by engagement of a corresponding pin 322 through a series of aligned apertures in each of arms 320 and second ends 304B, 306B.

Support structure 312 also has a pair of locking elements for holding top plate 314 securely against housing 30 when self-locking linkage 302 is in the locked position. In the illustrated embodiment, the locking elements are provided by a pair of snaps 323. Snaps 323 extend outwardly from the bottom portion of each of snap arms 318, and are thus positioned near projecting arms 320. Each snap 323 has an angled projection 324 along its top outside edge. In the illustrated embodiment, angled projections 324 are angled outwardly and downwardly from the outside edge of support arms 318. Snaps 323 also have lower angled sides 325 that are angled inwardly and downwardly from the outer edge of snaps 323. The configuration of angled projections 324 and angled sides 325 allows snaps 323 to slide out of locking receptacles 326 when sudden pressure relief device 300 is activated, as described below.

When sudden pressure relief device 300 is in the armed configuration (i.e. when self-locking linkage 302 is in the locked configuration), snaps 323, including angled projections 324, sit within a pair of locking receptacles 326 provided on the inside surface of the upper portion of housing 30. Locking receptacles 326 are outwardly extending channels shaped and positioned on the inside surface of housing 30 to receive snaps 323. The upper edge of each locking receptacle 326 has an angled portion 328. In the illustrated embodiment, angled portion 328 has a shape complementary to angled projections 324, i.e. angled portion 328 is angled inwardly and upwardly from the outside edge of the channel that provides locking receptacle 326.

When sudden pressure relief device 300 is in the armed configuration, snaps 323 are engaged with locking receptacles 326. Self-locking linkage 302 is in the locked configuration, so that pin 308 sits lower than either of pins 322, and bars 304, 306 are angled slightly downwardly in the inward direction. In this configuration, snap arms 318 are prevented from flexing in the inward direction because self-locking linkage 302 is in the locked position. The engagement of outwardly angled projections 324 on snaps 323 with angled portion 328 of locking receptacles 326 provides limiting features that prevents further movement of self-locking linkage 302 past the locked position. The physical interaction between the interacting surfaces of angled projections 324 and angled portion 328 also provides the desired level of resistance to prevent self-locking linkage 302 from moving into the unlocked configuration unless at least a predetermined amount of force has been applied.

Snaps 323 are thus retained in locking receptacles 326, and force applied against top plate 314 (e.g. as may be caused by an increase in pressure within tank 20) does not cause the seal between top plate 314 and the upper edge of housing 30 to be released.

To activate sudden pressure relief device 300 in response to a significant change in pressure within tank 20, sudden pressure relief device 300 has a regulating shaft 330 (best seen in FIGS. 9A-9D). A regulating member is engaged with regulating shaft 330 to control activation of sudden pressure relief device 300. In the illustrated embodiment, the regulating member is provided by a floating cylinder 332 that is engaged with shaft 330 and which is movable in the vertical (i.e. axial) direction, moving upwardly in response to increasing pressure within tank 20.

A spring 334 is provided that is compressed between top plate 314 and floating cylinder 332. Spring 334 and floating cylinder 332 are concentric with regulating shaft 330. Regulating shaft 330 projects upwardly through an aperture 342 in top plate 314, and thus regulating shaft 330 and floating cylinder 332 can move upwardly and downwardly relative to top plate 314. Spring 334 is compressed between top plate 314 and floating cylinder 332, so that spring 334 applies a downward force against floating cylinder 332. Thus, spring 334 holds floating cylinder 332 in the downward position, and resists the upward force applied on floating cylinder 332 caused by increases in the internal pressure within tank 20. Spring 334 is not required for the release of linkage 302, but is part of the mechanism for triggering release of linkage 302. The properties of spring 334 can be modified to adjust the pressure at which linkage 302 will be released.

As best shown in FIG. 9D, regulating shaft 330 is sealingly engaged with top plate 314. In the illustrated embodiment, the sealing engagement between regulating shaft 330 and top plate 314 is achieved by positioning an O-ring 335 between the two components. In the illustrated embodiment, O-ring 335 is set within an internal bore 337 provided in the outer circumference of aperture 342 in top plate 314, and sealingly engages the outside circumference of regulating shaft 330. However, any suitable means of providing a sealing engagement can be used, including for example forming an elastomeric or sealing member on either of regulating shaft 330 or top plate 314. By virtue of the sealing engagement of regulating shaft 300 and top plate 314 and housing 30 and top plate 314, increases in pressure inside the electrical device in which integrated fault monitor 22 is installed are contained within inner chamber 313 while top plate 314 remains sealed against housing 30, while outer chamber 315 remains at the external atmospheric pressure.

Floating cylinder 332 and regulating shaft 330 are thus movable in the upward direction in response to a sufficient increase in pressure within tank 20. In the illustrated embodiment, floating cylinder 332 includes an upper portion 336 and a lower portion 338 (FIG. 9B). Upper and lower portions 336, 338 are connected by side portions 340 (FIG. 9C). Upper portion 336 sits above the centre of self-locking linkage 302 (i.e. above pin 308), and lower portion 338 sits below the centre of self-locking linkage 302 (i.e. below pin 308). Side portions 340 of floating cylinder 332 extend on either side of the centre of self-locking linkage 302, so that the centre of self-locking linkage 302 is effectively enclosed within floating cylinder 332. Floating cylinder 332 is thus able to transfer a sufficient degree of vertical displacement of regulating shaft 330 to self-locking linkage 302, to move self-locking linkage 302 from the locked to the unlocked configuration.

As the pressure within tank 20 nears a predetermined threshold, floating cylinder 332 will begin to lift the centre of self-locking linkage 302, so that linkage 302 approaches dead centre. Once the predetermined pressure threshold has been reached, self-locking linkage 302 will be moved from the locked (i.e. armed) position to the triggered (i.e. unlocked) position (i.e. bars 304, 306 are caused to pivot about pins 308 and 322, so that pin 308 is moved upwardly). This permits snaps 323 to be inwardly deflected and allows outwardly angled projections 324 to slide past angled portion 328 of locking receptacles 326. In some embodiments, complementary angled surfaces 324 and 328 facilitate the inward deflection of snaps 323 in response to upward pressure applied to top plate 314 (and thus to snaps 323 via snap arms 318), although complementary angled surfaces 324, 328 could be omitted in some embodiments. This frees top plate 314 to be moved upwardly, thereby allowing the rapid venting of a buildup of pressure from tank 22 through a gap 327 between top plate 314 and housing 30. During such rapid venting, cap 32 contains and directs vented gases towards the electrical device in which integrated fault monitor 22 is installed, venting the gases through apertures 317. Such controlled rapid venting is preferable to other ways of releasing significant pressure buildup within the electrical device, for example, uncontrolled explosion of the electrical device.

During ordinary pressure fluctuations within tank 20, regulating shaft 332 can move upwardly and downwardly (i.e. in the axial direction) through aperture 342, which will slightly compress spring 334 (e.g. as shown in FIG. 9C). However, as spring 334 is compressed by upward movement of shaft 330 and floating cylinder 332, it applies a force to counteract the upward movement of regulating shaft 330, thereby limiting the amount of upward motion of floating cylinder 332 and regulating shaft 330. Once the internal pressure within the tank reaches a predetermined value, which is approximately 15-22 psig in some example embodiments, including any value therebetween, e.g. 16, 17, 18, 19, 20 or 21 psig, spring 334 is sufficiently compressed to allow floating cylinder 332 to move linkage 302 past dead centre, so that self-locking linkage 302 is released as described above.

In embodiments such as the illustrated embodiment in which sudden pressure relief device 300 is used together with an internal fault detector 100, an increase in pressure within the electrical device such as transformer 16 that is sufficient to activate sudden pressure relief device 300 will deflect diaphragm 104, thereby actuating both sudden pressure relief device 300 and internal fault detector 100.

Any suitable indicator can be used to provide an indication that sudden pressure relief device 300 has been actuated. For example, in some embodiments, mechanical indicators can be used to provide a visual indication that sudden pressure relief device 300 has been actuated. One example of a mechanical indicator is a spring-loaded axial or radial indicator that could be ejected from housing 30 in response to the actuation of sudden pressure relief device 300. Another example of a mechanical indicator is a series of ribbons, string, or other long visible object (any of which could optionally be made a bright colour) that can be moved by airflow that are fixed or tied at one end within housing 30 and initially fully contained within housing 30. Upon actuation of sudden pressure relief device 300, the free end of the ribbons, string, or other long visible object are forced out of housing 30, but the fixed end is retained with integrated fault monitor 22 via connection to housing 30 at one end. Visibility of the ribbons, string or other long visible object provides a visual indication that sudden pressure relief device 300 has been actuated. Another example of a mechanical indicator is a cap provided on housing 30 and initially covering a brightly coloured portion of housing 30, whereby the cap is ejected off housing 30 in response to a sufficient air pressure within transformer 16 to actuate sudden pressure relief device 300, so that the brightly coloured portion initially covered by the cap becomes visible.

In other embodiments, an electronic mechanism is used to provide an indication that sudden pressure relief device 300 has been actuated. For example, two electrical contacts, one positioned in housing 30 and one positioned in top plate 314, may be ordinarily in contact. That contact is broken by actuation of sudden pressure relief device 300, generating a signal that sudden pressure relief device 300 has been actuated. That signal can be transmitted by wired or wireless means to a monitoring station, so that the utility operating the electrical device in which sudden pressure relief device 300 is installed will be notified of the failure of that electrical device.

Activation of sudden pressure relief device 300 would generally accompany a catastrophic failure of an electrical device such as transformer 16. Consequently, after a sudden pressure relief device 300 has been actuated on a particular electrical device, that electrical device should generally be retired from use and replaced.

Integrated fault monitor 22 also includes a temperature sensor 400. Any suitable temperature sensor can be used to provide temperature sensor 400, shown schematically in FIGS. 8A, 8B, 10A and 10B. For example, temperature sensor 400 could be a bi-metallic strip (i.e. a strip consisting of two strips of different metals that expand at different rates as they are heated, causing the strip to bend if heated) or a thermal actuator, such as are commercially available, for producing a displacement in response to changes in temperature. In some embodiments, multiple different temperature sensors could be used as part of temperature sensor 400, if desired. One skilled in the art could select a suitable temperature sensor or combination of temperature sensors based on a desired application.

In some embodiments, including the illustrated embodiment, temperature sensor 400 provides a signal that a high temperature event has occurred. In some embodiments, the signal is an electronic signal. In some embodiments, the signal is a mechanical signal. In some embodiments, the change in configuration of temperature sensor 400 caused by an increase in temperature to a predetermined threshold contacts an electrical switch, to give an electronic indication that a high temperature event has occurred. In some embodiments, the change in configuration of temperature sensor 400 caused by an increase in temperature to a predetermined threshold moves a mechanical element, to give a mechanical indication that a high temperature event has occurred.

In the illustrated embodiment, temperature sensor 400 is configured to activate a mechanical high temperature indicator 402 (FIG. 2B). In the illustrated embodiment, high temperature indicator 402 is a brightly coloured portion that is positioned to be rotated or pushed into view when temperature sensor 400 detects a high temperature event (i.e. the change in configuration of temperature sensor 400 caused by an increase in temperature to a predetermined threshold causes movement of high temperature indicator 402 to render high temperature indicator 402 visible outside housing 30 and tank 20).

In some embodiments, the predetermined threshold at which temperature sensor 400 generates a signal indicating that a high temperature event has occurred is in the range of 95° C. to 160° C. for typical oil-filled electrical equipment, including any value therebetween, e.g. 100, 105, 110, 115, 120, 125, 130, 135, 140, 145, 150 or 155° C.

In some embodiments, an electrical device such as transformer 16 that is operating at an elevated temperature may not be suitably robust to perform the job for which it has been deployed, and elevated temperature can provide an early indication that the electrical device is likely to eventually fail. Thus, activation of a high temperature indicator, such as high temperature indicator 402, can provide an indication to an operator that the electrical device cannot perform the function for which it has been deployed, and should be replaced with an electrical device that can perform the intended function. If this indication is noted early enough in the lifespan of the electrical device, it may be possible for an operator to re-deploy the electrical device to perform some other function, which may save the expense of having the electrical device fail.

While a number of exemplary aspects and embodiments have been discussed above, those of skill in the art will recognize certain modifications, permutations, additions and sub-combinations thereof. For example, in some embodiments, components of integrated fault monitor 22 may be used independently of one another, or replaced with a different mechanism for performing the same function. For example, in some embodiments, an integrated fault detector 100 is used alone on a piece of electrical equipment, without a temperature sensor, pressure relief valve, and/or sudden pressure relief device. In some embodiments, an integrated fault detector 100 is used on a piece of electrical equipment together with one or more of a temperature sensor, pressure relief valve, and/or sudden pressure relief device that differs from the example embodiments described herein. For example, in some embodiments, integrated fault detector 100 is used together with a sudden pressure relief device, but the structure of the sudden pressure relief device is a rupturing diaphragm (i.e. a burst disc) that ruptures to release pressure once a sufficiently high level of pressure has built up inside tank 22, rather than a sudden pressure relief device 300 as described herein. In other embodiments, a different structure could be used to release self-locking linkage 302 of sudden pressure relief device 300, for example, a sealed diaphragm that deflects upwardly to release self-locking linkage 302, or a bellows-based system that expands upwardly in response to a change in pressure to release self-locking linkage 302.

In some embodiments, a sudden pressure relief device 300 is used alone on a piece of electrical equipment, without an internal fault detector, temperature sensor, and/or pressure relief valve. In some embodiments, a sudden pressure relief device 300 is used on a piece of electrical equipment together with one or more of a temperature sensor, pressure relief valve, and/or internal fault detector that differs from the example embodiments described herein. For example, in some embodiments, sudden pressure relief device 300 is used together with an integrated fault detector, optionally also integrating a pressure relief valve, such as that described in WO 2011/153604.

It is intended that the following appended claims and claims hereafter introduced are not to be limited by the preferred embodiments described herein, but are to be given the broadest interpretation consistent with the specification as a whole.

Without limiting the foregoing, some embodiments of the present invention encompass the following aspects:

[1] An integrated fault monitoring apparatus for electrical devices, the apparatus comprising:
  a housing for mounting in an electrical device, the housing comprising:
    an internal fault detector for detecting transient pressure surges within the electrical device;
    a pressure relief valve for allowing release of pressure during normal operating conditions of the electrical device;
    a temperature indicator for indicating that an operating temperature of the electrical device has gone above a predetermined threshold; and
    a sudden pressure relief device for allowing air to escape from the electrical device in the event of a sudden and significant increase in pressure within the electrical device.

[2] An internal fault detector for detecting transient pressure surges within an electrical device, the internal fault detector comprising a housing, wherein the internal fault detector comprises a two-bar self-locking linkage.

[3] A sudden pressure relief device for allowing air to escape from an electrical device in the event of a sudden and significant increase in pressure within the electrical device through a housing of the sudden pressure relief device, the sudden pressure relief device comprising a two-bar self-locking linkage.

[4] An integrated fault monitoring apparatus as defined in aspect [1], wherein the internal fault detector and/or the sudden pressure relief device comprise a two-bar self-locking linkage.

[5] An integrated fault monitoring apparatus as defined in either one of aspects [1] or [4], or an internal fault detector as defined aspect [2], wherein the internal fault detector comprises:
  a two-bar self-locking linkage; and
  a pressure sensing member adapted to convert a transient pressure surge within the electrical device to translational motion, wherein the translational motion optionally comprises movement in the vertical direction, and wherein the translational motion optionally comprises a translation of at least 2 mm, and wherein the transient pressure surge optionally comprises a change in pressure greater than approximately 0.25 to 1.5 pounds per square inch within a time period of approximately 5-7 milliseconds,
  the pressure sensing member being operatively disposed to move the two-bar self-locking linkage from an armed configuration in which the self-locking two-bar linkage is rigid to a triggered configuration in which the self-locking two-bar linkage is rotatable about a central rotation point of the linkage upon the occurrence of a transient pressure surge.

[6] An integrated fault monitoring apparatus or an internal fault detector as defined aspect [5], further comprising an indicator adapted to provide a signal in response to movement of the two-bar self-locking linkage from the armed configuration to the triggered configuration, wherein the indicator optionally comprises a mechanical indicator or an electronic indicator, and wherein the mechanical indicator optionally comprises rotation of an indicator from a non-visible to a visible position.

[7] An integrated fault monitoring apparatus or an internal fault detector as defined in either one of aspects [5] or [6], wherein the two-bar self-locking linkage comprises:
  first and second bars pivotally coupled together at a central rotation point, the first and second bars being generally longitudinally aligned but angled slightly inwardly and downwardly when the two-bar self-locking linkage is in the locked configuration; and a retaining surface that prevents further rotation of the two-bar self-locking linkage past the armed configuration, wherein the retaining surface optionally comprises an angled surface provided on one of the first and second bars that contacts the housing when the two-bar self-locking linkage is in the armed configuration.

[8] An integrated fault monitoring apparatus or an internal fault detector as defined in any one of aspects [5] to [7], wherein a free end of one of the first and second bars is pivotally coupled to the housing, and a free end of the other one of the first and second bars is forced inwardly by a resilient member, wherein the resilient member optionally comprises a spring, wherein the spring optionally comprises a coil spring, and wherein optionally the resilient member extends between the free end of the other one of the first and second bars and the housing.

[9] An integrated fault monitoring apparatus or an internal fault detector as defined in any one of aspects [5] to [8], comprising an angled activator arm extending from one of the first and second bars proximate the central rotation point, wherein the angled activator arm optionally extends vertically above the first and second bars.

[10] An integrated fault monitoring apparatus or an internal fault detector as defined in aspect [9], wherein the angled activator arm contacts a rotatable member that is operatively disposed to rotate a shaft coupled to an indicator outside the housing upon movement of the two-bar self-locking linkage from the armed configuration to the triggered configuration, wherein rotation of the shaft causes the indicator to rotate from the non-visible position to the visible position

[11] An integrated fault monitoring apparatus or an internal fault detector as defined in any one of aspects [5] to [10], wherein the pressure sensing member comprises a diaphragm with an aperture therethrough, the periphery of the diaphragm being in sealing engagement with the housing so that air is only able to move past the diaphragm by flowing through the aperture, wherein optionally a spindle is provided for transferring translation of the diaphragm caused by a transient pressure surge to the two-bar self-locking linkage to move the linkage from the armed configuration to the triggered configuration, wherein optionally the spindle is in contact with the two-bar self-locking linkage at a point near the central rotation point of the two-bar self-locking linkage, and wherein optionally the diaphragm is positioned vertically below the two-bar self-locking linkage.

[12] An integrated fault monitoring apparatus as defined in any one of aspects [1] or [4] to [11], or a sudden pressure relief device as defined in aspect [3], wherein the sudden pressure relief device comprises:

a two-bar self-locking linkage;

a pair of snap-fit restraining members engaged with a release plate of the housing to secure the release plate in a closed position, the snap-fit restraining members being retained in a secured configuration when the two-bar self-locking linkage is in an armed configuration in which the self-locking two-bar linkage is rigid, the snap-fit restraining members being moveable to a released position allowing the release plate of the housing to move to an open position when the two-bar self-locking linkage is moved to a triggered configuration in which the two-bar self-locking linkage is rotatable about a central rotation point of the linkage upon an increase in pressure within the housing above a predetermined threshold, wherein the release plate optionally comprises a top plate of the housing; and a mechanism for converting increases in pressure within the housing to translational movement, the mechanism being operatively engaged with the self-locking two-bar linkage to move the self-locking two-bar linkage from the armed configuration to the triggered configuration upon an increase in pressure within the electrical device above a predetermined threshold, wherein the predetermined threshold optionally comprises 15 to 22 psig, and wherein the mechanism optionally comprises a floating cylinder, an expandable bellows, or a sealed diaphragm.

[13] An integrated fault monitoring apparatus or a sudden pressure relief device as defined in aspect [12], wherein the two-bar self-locking linkage comprises:

first and second bars pivotally coupled together at a central rotation point, the first and second bars being generally longitudinally aligned but angled slightly inwardly and downwardly when the two-bar self-locking linkage is in the locked configuration, a free end of each one of the first and second bars being pivotally engaged with a respective one of the pair of snap-fit restraining members.

[14] An integrated fault monitoring apparatus or a sudden pressure relief device as defined in either one of aspects [12] or [13], wherein:

an O-ring seal interposes the housing and the top plate;

the snap-fit restraining members depend downwardly from the top plate of the housing and are received within locking receptacles provided on the housing when the top plate is in the closed position;

the snap-fit restraining members comprise an outwardly projecting angled upper portion that engages with a correspondingly angled portion of the locking receptacles and slides past the correspondingly angled portion of the locking receptacles when the two-bar self-locking linkage moves from the armed to the triggered position; and/or the snap-fit restraining members comprise lower angled sides that are angled inwardly and downwardly from the outer edges of the snap-fit restraining members.

[15] An integrated fault monitoring apparatus or a sudden pressure relief device as defined in any one of aspects [12] to [14], wherein:

the mechanism for converting increases in pressure within the housing to translational movement comprises a floating cylinder and the floating cylinder contacts the central rotation point of the two-bar self-locking linkage;

a regulating shaft is provided on the floating cylinder, a first end of the regulating shaft projecting through an aperture provided in the release plate, wherein optionally an O-ring seal interposes the regulating shaft and the release plate;

a release regulator is provided to apply a counteracting force on the floating cylinder to counteract a force applied by increases in pressure within the electrical device, wherein the release regulator optionally comprises a spring, and the spring optionally comprises a coil spring disposed around and concentric with the regulating shaft; and the properties of the release regulator are selected to allow the two-bar self-locking linkage to move from the armed configuration to the triggered configuration when the pressure within the electrical device increases above the predetermined threshold.

[16] An integrated fault monitoring apparatus or a sudden pressure relief device as defined in aspect [15], wherein:
the housing and the release plate define an inner chamber to contain increases in pressure within the electrical device; and
a cap is provided over the housing and the release plate to define an outer chamber, the outer chamber being at external atmospheric pressure so that the first end of the regulating shaft is exposed to external atmospheric pressure and a second end of the regulating shaft contacts the floating cylinder within the inner chamber;
wherein the cap optionally comprises one or more apertures to facilitate controlled venting of gases from the electrical device in the event of an increase in pressure within the electrical device above the predetermined threshold.

[17] An integrated fault monitoring apparatus or a sudden pressure relief device as defined in any one of aspects [12] to [16], comprising an indicator for indicating that the sudden pressure relief device has been actuated, wherein the indicator comprises a mechanical indicator and/or an electronic indicator; wherein the mechanical indicator optionally comprises a spring-loaded axial or radial indicator that is released from the housing, one or more than one long visible objects that are coupled at one end to the housing and initially retained within the housing, but which is released so that the free end extends outside the housing and is visible when the sudden pressure relief device has been actuated, wherein the long visible object optionally comprises string or ribbon, and/or a cap initially covering a brightly coloured portion of the housing, the cap being ejected off the housing in response to actuation of the sudden pressure relief device so that the brightly coloured portion is rendered visible.

[18] An integrated fault monitoring apparatus as defined in any one of aspects [1] or [4] to [17], wherein the temperature indicator comprises a bi-metallic strip or a thermal actuator, wherein the temperature indicator is configured to provide an electronic and/or manual indication that a high temperature event has occurred, wherein the mechanical indicator for indicating a high temperature event has occurred optionally comprises a brightly coloured element positioned outside the housing that is initially not visible, but is pushed or rotated into view by movement of the bi-metallic strip or thermal actuator upon the occurrence of a high temperature event.

[19] An integrated fault monitoring apparatus as defined in any one of aspects [1] or [4] to [18], wherein the temperature indicator provides an indication that a high temperature event has occurred when the temperature sensor detects a temperature of at least 95° C. to 160° C.

[20] An integrated fault monitoring apparatus as defined in any one of aspects [1] or [4] to [19], wherein the pressure relief valve comprises an axially movable valve member biased into engagement with a valve seat, wherein the pressure relief valve is configured to provide a manual or electronic indication it has been actuated, and wherein optionally the manual indication comprises a brightly coloured region that is initially covered but that is exposed when the pressure relief valve is actuated, and wherein optionally the pressure relief valve is actuated if there is a pressure differential of 5 psi, 7 psi or 10 psi between an ambient pressure and a pressure inside an electrical device in which the integrated fault monitoring apparatus is installed.

[21] An integrated fault monitoring apparatus as defined in any one of aspects [1] or [4] to [20], an integrated fault monitor as defined in aspect [2], or a sudden pressure relief device as defined in aspect [3], comprising a wave pattern splash guard covering a base of the housing, wherein the wave pattern splash guard optionally comprises a plurality of interwoven vertically extending bars provided with a sinusoidal shape in the horizontal direction.

[22] An electrical device comprising an integrated fault monitoring apparatus as defined in any one of the preceding aspects, wherein the integrated fault monitoring apparatus is installed in a top portion of the electrical device, wherein the electrical device optionally comprises a transformer, including a pole-type transformer, a pad-mount transformer, or a voltage regulator.

The invention claimed is:

1. An integrated fault monitoring apparatus for electrical devices, the apparatus comprising:
a housing for mounting in fluid communication with an electrical device, the housing comprising:
an internal fault detector for detecting transient pressure surges within the electrical device;
a pressure relief valve for allowing release of pressure during normal operating conditions of the electrical device;
a temperature sensor; and
a temperature indicator operably connected to the temperature sensor for indicating that an operating temperature of the electrical device has gone above a predetermined threshold.

2. An integrated fault monitoring apparatus as defined in claim 1, further comprising a sudden pressure relief device for allowing air to escape from the electrical device and for directing gases or hot oil to a safe dispersal location in the event of a sudden and significant increase in pressure within the electrical device.

3. An integrated fault monitoring apparatus as defined in claim 2, wherein the sudden pressure relief device comprises a rupturing diaphragm.

4. An integrated fault monitoring apparatus as defined in claim 2, wherein the sudden pressure relief device comprises:
a two-bar self-locking linkage;
a retention mechanism engaged with a release plate of the housing to secure the release plate in a closed position, the retention mechanism being retained in a secured configuration when the two-bar self-locking linkage is in an armed configuration in which the two-bar self-locking linkage is rigid, the retention mechanism being moveable to a released position allowing the release plate of the housing to move to an open position when the two-bar self-locking linkage is moved to a triggered configuration in which the two-bar self-locking linkage is rotatable about a central rotation point of the linkage upon an increase in pressure within the housing above a predetermined threshold; and
a mechanism for converting increases in pressure within the housing to movement, the mechanism being operatively engaged with the two-bar self-locking linkage to move the two-bar self-locking linkage from the armed configuration to the triggered configuration upon an increase in pressure within the electrical device above the predetermined threshold.

5. An integrated fault monitoring apparatus as defined in claim 4 wherein the retention mechanism comprises a pair of snap-fit restraining members.

6. An integrated fault monitoring apparatus as defined in claim 5, wherein the two-bar self-locking linkage comprises:

first and second bars pivotally coupled together at a central rotation point at a first end of each one of the first and second bars, the first and second bars being generally longitudinally aligned but angled slightly inwardly and downwardly when the two-bar self-locking linkage is in the armed configuration, a second end of each one of the first and second bars being pivotally engaged with a respective one of the pair of snap-fit restraining members.

7. An integrated fault monitoring apparatus as defined in claim 5, wherein:
the snap-fit restraining members are provided on opposite edges of and depend downwardly from the release plate and are received within locking receptacles provided on the housing when the release plate is in the closed position;
the snap-fit restraining members comprise an outwardly projecting angled upper portion that engages with a correspondingly angled portion of the locking receptacles and slides past the correspondingly angled portion of the locking receptacles when the two-bar self-locking linkage moves from the armed configuration to the triggered configuration; and
the snap-fit restraining members comprise lower angled sides that are angled inwardly and downwardly from outer edges of the snap-fit restraining members.

8. An integrated fault monitoring apparatus as defined in claim 4, wherein:
the mechanism for converting increases in pressure within the housing to translational movement comprises a floating cylinder and the floating cylinder contacts the central rotation point of the two-bar self-locking linkage;
a regulating shaft is provided on the floating cylinder, a first end of the regulating shaft projecting through an aperture provided in the release plate;
a release regulator is provided to apply a counteracting force on the floating cylinder to counteract a force applied by increases in pressure within the electrical device; and
the properties of the release regulator are selected to allow the two-bar self-locking linkage to move from the armed configuration to the triggered configuration when the pressure within the electrical device increases above the predetermined threshold.

9. An integrated fault monitoring apparatus as defined in claim 8, wherein the release regulator comprises a coil spring disposed around and concentric with the regulating shaft.

10. An integrated fault monitoring apparatus as defined in claim 8, wherein:
the housing and the release plate define an inner chamber to contain increases in pressure within the electrical device; and
a cap is provided over the housing and the release plate to define an outer chamber, the outer chamber being at external atmospheric pressure so that the first end of the regulating shaft is exposed to external atmospheric pressure and a second end of the regulating shaft contacts the floating cylinder within the inner chamber;
wherein the cap comprises one or more apertures to facilitate controlled venting of gases from the electrical device in the event of an increase in pressure within the electrical device above the predetermined threshold.

11. An integrated fault monitoring apparatus defined in claim 4, wherein the predetermined threshold comprises 15 to 22 psig.

12. A sudden pressure relief device as defined in claim 4 comprising an indicator adapted to provide a signal in response to movement of the two-bar self-locking linkage from the armed configuration to the triggered configuration.

13. An integrated fault monitoring apparatus as defined in claim 4 mounted on the tank of a piece of electrical equipment, wherein the mechanism for converting increases in pressure within the housing to movement is located externally of the tank of the piece of electrical equipment.

14. An integrated fault monitoring apparatus as defined in claim 1, wherein the temperature sensor comprises a bi-metallic strip or a thermal actuator.

15. An integrated fault monitoring apparatus as defined in claim 1, wherein the temperature indicator is configured to provide an electronic indication that the operating temperature of the electrical device has gone above the predetermined threshold.

16. An integrated fault monitoring apparatus as defined in claim 1, wherein the temperature indicator is configured to provide a visual indication that the operating temperature of the electrical device has gone above the predetermined threshold.

17. An integrated fault monitoring apparatus as defined in claim 16, wherein the visual indication comprises a brightly coloured element positioned outside the housing that is initially not visible, but is pushed or rotated into view by movement of the temperature sensor when the operating temperature of the electrical device has gone above the predetermined threshold.

18. An integrated fault monitoring apparatus as defined in claim 1, wherein the predetermined temperature threshold is between 95° C. and 160° C.

19. An integrated fault monitoring apparatus as defined in claim 1, wherein the pressure relief valve comprises an axially movable valve member biased into engagement with a valve seat, wherein the pressure relief valve is configured to provide a visual indication it has been actuated, wherein the visual indication comprises a brightly coloured region that is initially covered but that is exposed when the pressure relief valve is actuated.

20. An integrated fault monitoring apparatus as defined in claim 1, wherein the pressure relief valve comprises an axially movable valve member biased into engagement with a valve seat, wherein the pressure relief valve is configured to provide an electronic indication it has been actuated.

21. An integrated fault monitoring apparatus as defined in claim 1, wherein the internal fault detector is configured to detect a transient pressure surge that comprises a change in pressure greater than 0.25 to 1.5 pounds per square inch within a time period of 5 to 7 milliseconds.

22. An integrated fault monitoring apparatus as defined in claim 1 mounted on the tank of a piece of electrical equipment, wherein the housing extends externally of the tank of the piece of electrical equipment.

* * * * *